(12) United States Patent
Wu et al.

(10) Patent No.: US 7,142,020 B2
(45) Date of Patent: *Nov. 28, 2006

(54) RESONANT LOGIC AND THE IMPLEMENTATION OF LOW POWER DIGITAL INTEGRATED CIRCUITS

(75) Inventors: Jianbin Wu, Fremont, CA (US); Weiwei Guo, Pleasanton, CA (US); Yuan Yao, San Jose, CA (US)

(73) Assignee: PicoNetics, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/922,182

(22) Filed: Aug. 18, 2004

(65) Prior Publication Data

US 2005/0077922 A1   Apr. 14, 2005

Related U.S. Application Data

(63) Continuation of application No. 10/388,841, filed on Mar. 14, 2003, now Pat. No. 6,812,745, which is a continuation of application No. 09/967,189, filed on Sep. 27, 2001, now Pat. No. 6,559,681, which is a continuation-in-part of application No. 09/614,494, filed on Jul. 11, 2000, now Pat. No. 6,448,816.

(51) Int. Cl.
*H03K 19/096* (2006.01)
(52) U.S. Cl. .......................... 326/98; 326/112; 326/93
(58) Field of Classification Search .............. 326/112, 326/119, 121, 37–41
See application file for complete search history.

(56) References Cited

U.S. PATENT DOCUMENTS 3,651,334 A   3/1972   Thompson et al. ......... 307/208

4,562,365 A   12/1985   Redfield et al. ............. 307/471

(Continued)

FOREIGN PATENT DOCUMENTS

| EP | 0 626 757 A3 | 11/1994 |
|---|---|---|
| JP | 63-093223 | 4/1988 |

OTHER PUBLICATIONS

Athas et al., "Low-Power Digital Systems Based on Adiabatic-Switching Principals," *IEEE Transactions on Very Large Scale Integration (VLSI) Systems*, vol. 2, No. 4, Dec. 1994, pp. 398-409.

(Continued)

*Primary Examiner*—Don Le
(74) *Attorney, Agent, or Firm*—Anthony B. Diepenbrock, III; Dechert LLP

(57) ABSTRACT

A method and apparatus for operating logic circuitry with recycled energy. Logic circuitry is used which has a node for storing energy and a return node that is connected to energy storage circuitry. The logic circuitry operates, using energy stored on the node, to determine a logic output based on a logic input during a first phase. The energy storage circuitry capture a portion of the stored energy during the operation of the logic circuitry and transfers a portion of the captured energy back to the node during a second phase. The energy storage circuitry oscillates with a determinable period and is tunable so that its oscillations can be synchronized to a clock.

18 Claims, 17 Drawing Sheets

U.S. PATENT DOCUMENTS

| | | | |
|---|---|---|---|
| 4,570,085 A | 2/1986 | Redfield | 307/453 |
| 4,599,528 A | 7/1986 | Redfield | 307/443 |
| 5,559,478 A | 9/1996 | Athas et al. | 331/117 |
| 6,028,454 A | 2/2000 | Elmasry et al. | 326/115 |
| 6,208,170 B1 | 3/2001 | Iwaki et al. | 326/121 |
| 6,246,266 B1 | 6/2001 | Bosshart | 326/98 |
| 6,255,853 B1 | 7/2001 | Houston | 326/98 |

OTHER PUBLICATIONS

Tzartzanis et al., "Design and Analysis of a Low-Power Energy-Recovery Adder," *IEEE*, 1995, pp. 66-69.

W. Athas et al., "AC-1: a clock-powered microprocessor," *Proceedings of the 1997 International Symposium on Low Power Electronics and Design*, Aug. 18-20, 1997, Islped '97. ACM Press. pp. 328-333.

Chun-Keung Lo & Philip C. H. Chan, "*An Adiabatic Differential Logic for Low-Power Digital Systems,* " *IEEE Transactions on Circuits and Systems II: Analog and Digital Signal Processing*, vol. 46, Issue 9, Sep. 1999, pp. 1245-1250.

NAND-2 GATE

OR-2 GATE

AND2

Waveform for AND2

NAND2

Waveform for NAND2

RESONANT LOGIC AND THE IMPLEMENTATION OF LOW POWER DIGITAL INTEGRATED CIRCUITS

CROSS REFERENCE TO RELATED APPLICATIONS

This application is a continuation of a regular U.S. Application, titled "RESONANT LOGIC AND THE IMPLEMENTATION OF LOW POWER DIGITAL INTEGRATED CIRCUITS", Ser. No. 10/388,841, filed on Mar. 14, 2003 is now a U.S. Pat. No. 6,812,748, which is a continuation of a regular U.S. Application, titled "RESONANT LOGIC AND THE IMPLEMENTATION OF LOW POWER DIGITAL INTEGRATED CIRCUITS", Ser. No. 09/967,189, filed on Sep. 27, 2001, now U.S. Pat. No. 6,559,681, which is a continuation-in-part of regular U.S. Application, titled "RESONANT LOGIC AND THE IMPLEMENTATION OF LOW POWER DIGITAL INTEGRATED CIRCUITS", Ser. No. 09/614,494, filed on Jul. 11, 2000, now U.S. Pat. No. 6,448,816.

BACKGROUND OF THE INVENTION

1. Field of the Invention

The present invention generally relates to reduced power operation of digital circuitry and more specifically to a method and apparatus for operating logic circuitry with alternating power phases.

2. Description of the Related Art

Advances in VLSI fabrication in recent years have greatly increased the levels of integration in digital integrated circuitry with the advent of submicron geometries. However, there has also been an increase in the speed and functionality in such circuitry. One example is the Pentium III microprocessor, which has several million transistors in a 1 cm² area. While these trends are good from the standpoint of delivering increased capabilities to the electronics consumer there has developed a major problem, which is the power consumption of these devices. The Pentium III processor, while having exceptional performance, also has exceptional power dissipation—in the range of about 27 watts for an 866 MHz Pentium III. Adding to the problem, many portable computer systems, such as laptops, personal organizers and cellular telephones, demand the use of the highest performance integrated circuitry but do not have the battery power to run such circuitry for extended periods of time. Battery systems simply have not kept pace with the demands of the technology. To make matters worse, many portable or mobile systems have physical size constraints that preclude the use of extensive cooling devices to remove the power from the integrated circuitry.

Most of the digital integrated circuitry used for today's high performance and high power devices is CMOS circuitry. Power consumption for CMOS circuitry is the sum of static power dissipation and dynamic power dissipation. The former $P_S$ is the result of leakage current while the latter $P_D$ is the sum of transient power consumption $P_T$ and capacitive-load power consumption $P_L$.

Transient power consumption $P_T$, in turn, results from current that travels between the supply and ground (known as through current) when the CMOS device switches and current required to charge internal switching nodes within the device (known as switching current), the charging and discharging of internal nodes being the predominant cause. Capacitive-load power consumption $P_L$ is caused by charging and discharging an external load capacitance.

FIG. 1 shows a typical CMOS inverter circuit 10 which includes a p-channel MOS transistor 12 and an n-channel MOS transistor 14, the gates 16, 18 of the transistors 12, 14 being connected together and to the inverter input 20, the drains 22, 24 of the transistors being connected together and to the inverter output 26. The source 30 of the p-channel transistor 12 is connected to the voltage supply Vdd and the source 28 of the n-channel transistor 14 is connected to ground (Vss). The output of the inverter 26 is connected to other CMOS circuitry whose loading characteristics are capacitive in nature. This external capacitive loading is modeled by a capacitor 32 connected to the inverter output 26. When the input 20 to the logic circuit 10 is driven low, p-channel transistor 12 turns on, causing the capacitive load 32 with value $C_L$ to be charged from the supply Vdd through the p-channel transistor 12 and registering a logic ONE at the output 26. Similarly, when the input 20 is driven high, the p-channel transistor 12 turns off and the n-channel transistor 14 turns on, allowing charge stored in the capacitive load 32 to be transferred through the n-channel transistor 14 to ground, thus registering a logic ZERO at the output 26. Each cycle of the input signal results in a transfer of charge to and from the capacitive load, which is equivalent to an energy transfer of $(\frac{1}{2} \times C_L \times \Delta V_c^2)$ to charge and $(\frac{1}{2} \times C_L \times \Delta V_d^2)$ to discharge the capacitive load, where $C_L$ is the value of the capacitive load, $\Delta V_c$, is the change in voltage across the capacitive load when charging the load and $\Delta V_d$, is change in voltage across the capacitive load when discharging the load. This energy $\frac{1}{2} \times C_L \times (\Delta V_c^2 + \Delta V_d^2)$ is dissipated as heat. Ultimately, the dynamic energy, on the order of $10^{-12}$ Joules (assuming $C_L$ to be about 1 pf, which includes load and wiring capacitance, and $\Delta V$ to be about a volt), used to operate the circuit of FIG. 1 over a single cycle is lost.

Furthermore, if the cycle of charging and discharging occurs at a frequency f, then the power consumed by the circuit of FIG. 1 is approximately $f \times C \times (\Delta V)^2$ where equal voltage changes are assumed for charging and discharging. Currently, the frequency of operation of CMOS circuits is as high as $10^9$ Hz. This means that even though the energy consumed over one cycle by a simple CMOS gate is very low, the power consumed when a gate is operated continuously at very high frequencies can be appreciable (on the order of $10^{-3}$ Watts). When there are millions of such gates on a semiconductor die the problem is again multiplied resulting in many tens of Watts being consumed and a large fraction of that power being dissipated as heat.

A common approach to alleviate this problem has been to reduce the supply voltage because the savings in power consumption is proportional to the square of the voltage reduction. However, reduction of the power supply voltage causes other problems which include increasing the susceptibility of the circuit to noise and increased transistor leakage current because the threshold voltage of the MOS transistors must be reduced to permit the devices to operate on the lower supply voltage.

Therefore, there is a need for high-speed, high-functionality integrated circuit devices that have very low power consumption without depending on low supply voltages to achieve the reduction in power consumption.

BRIEF SUMMARY OF THE INVENTION

The present invention is directed towards such a need. A system in accordance with the present invention includes logic circuitry connected between an output node and a return node and having at least one logic input, where logic circuitry is operative to evaluate a logic function of the input during a first phase using energy available to the logic circuitry, and energy storage circuitry connected to the return node to capture a portion of the energy available to the logic circuitry during the first phase and to make the captured energy available to the logic circuitry during a second phase, wherein the first phase and the second phase are intervals in a resonant cycle present on the return node.

A method in accordance with the present invention includes evaluating a logic function of the logic circuitry during a first phase using energy available to the logic circuitry; and capturing a portion of the energy available to the logic circuitry during the first phase and making the captured energy available to the logic circuitry during a second phase, wherein the first phase and the second phase are intervals in a resonant cycle.

An advantage of the present invention is that higher performance and greater functionality is available for portable devices.

Another advantage is that the need for special cooling equipment is avoided or reduced and yet another advantage is that the battery life of portable equipment is longer.

Yet another advantage is that the packaging for the logic circuitry has fewer power supply and ground pins because the operating power for the logic circuitry is substantially reduced. This results in a simpler and less costly package.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 1:
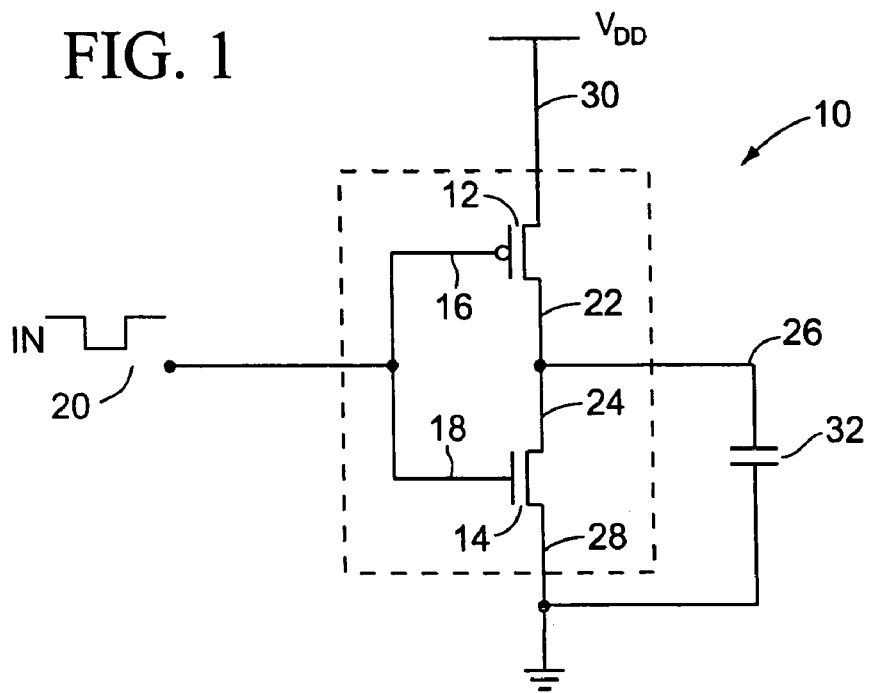
FIG. 1 shows a conventional CMOS inverter circuit.
Figure 2A:
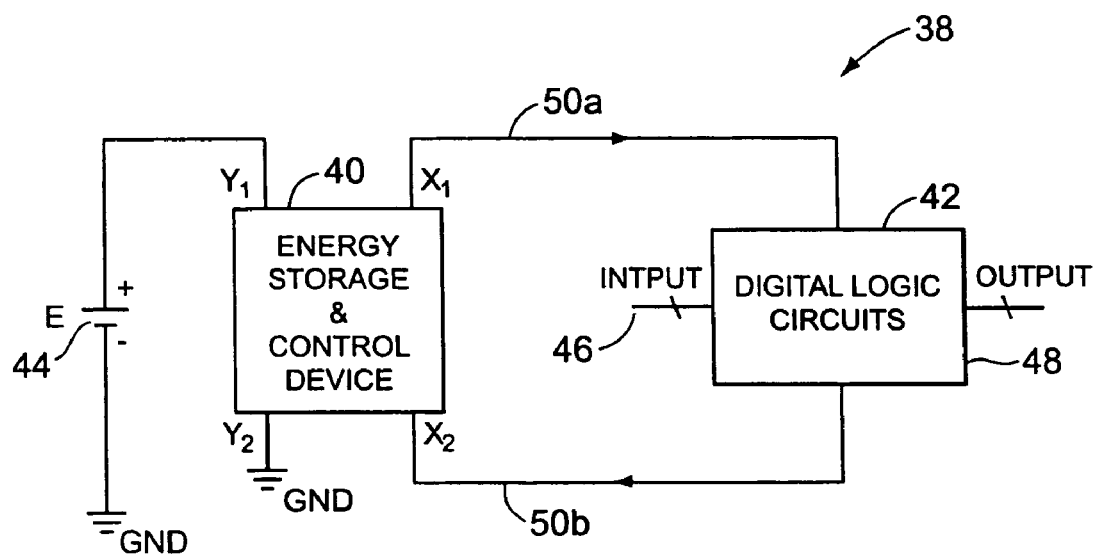
FIG. 2A shows a general block diagram of an apparatus in accordance with the present invention.

FIG. 2A shows a general block diagram of an apparatus 38, in accordance with the present invention. The apparatus 38 of FIG. 2A includes an energy storage and control device 40 and digital logic circuitry 42 having at least one input 46 and at least one output 48. In general terms, the energy storage device and control device 40 is a two-port device, one port Y1–Y2 being connected to a main power source 44 and the other port X1–X2 being connected to the supply and return lines of the digital logic circuitry 42. The energy storage and control device 40 has two important functions. First, the energy storage and control device 40 provides operational energy to and recaptures operational energy from the digital logic circuitry 42. Second, it acts as a conduit to transfer energy from the main power supply 44 Y1–Y2 port to the digital logic circuitry 42 port X1–X2 to make up for the actual energy lost due to heat dissipation in the digital logic circuitry. Thus, the total amount of energy dissipated in the system is equal to the energy provided by the main power supply. In some embodiments of the present invention, the supply line 50a and return line 50b connected to the digital logic circuitry 42 are a single line.

Figure 2B:
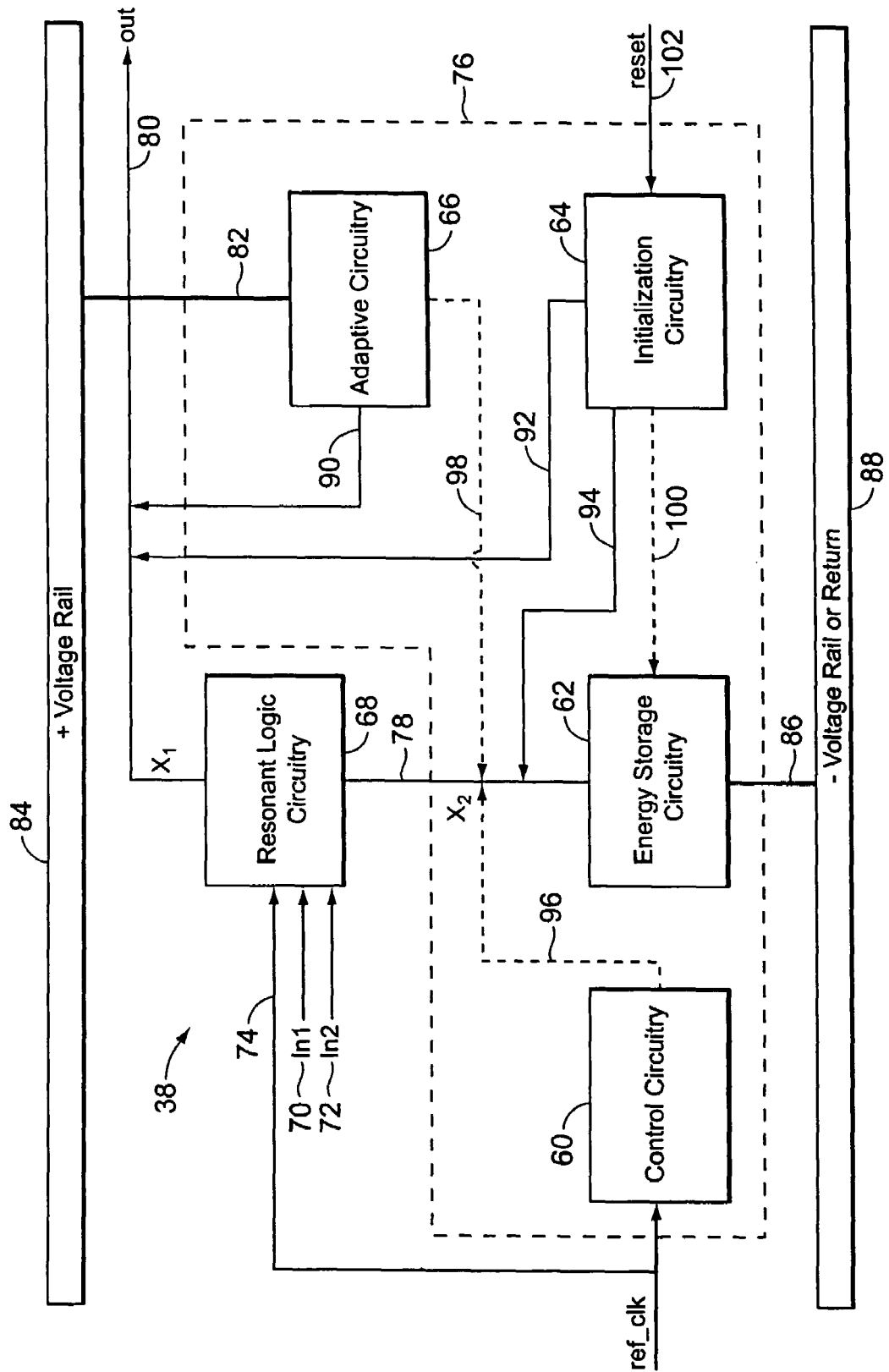
FIG. 2B shows a more detailed block diagram of the apparatus of FIG. 2A.

FIG. 2B shows a more detailed block diagram of the apparatus 38 of FIG. 2A, which includes control circuitry 60, energy storage circuitry 62, initialization circuitry 64, adaptive circuitry 66 and resonant logic circuitry 68 having nodes X1 and X2, inputs In 1 70 and In2 72 and in some embodiments a clock, ref_clk 74. Control circuitry 60, energy storage circuitry 62, initialization circuitry 64 and adaptive circuitry 66 are collectively referred to as a PicoEngine™ dynamic power supply 76.

Energy storage circuitry 62 connects to the X2 node 78 of the logic circuitry 68, whose output is the XI node 80. The XI node 78 is called the energy storage node and the X2 node 78 is called the return node. Adaptive control circuitry 66 connects via path 82 to the +Voltage Rail 84 to supply needed energy to the energy storage circuitry 62 and the logic circuitry 68. Energy storage circuitry 62 connects via path 86 to the −Voltage Rail or Return 88. The connection 82 by the adaptive control circuitry to the +Voltage Rail and the connection 86 by the energy storage circuitry to the −Voltage Rail or Return are the connections by which the logic circuitry 68 and energy storage circuitry 62 receive power from a power supply, which only supplies the energy to make up for the dissipative losses in the circuit. The energy storage circuitry 62 supplies power to the resonant logic circuitry 68 for its operation and the energy storage circuitry 62 or the logic circuitry 68 receive power from the power supply only to make up for dissipative losses.

In a first alternative (solid connections), the reference clock ref_clk 74 is connected both to the control circuitry 60 and to the logic circuitry 68, and the adaptive circuitry 66 and initialization circuitry 64 are connected via paths 90, 92 respectively, to the output XI 80 of the logic circuitry 68. The initialization circuitry is also connected via path 94 to the X2 node 78. In this alternative, energy storage circuitry 62 and logic circuitry 68 combine to form a resonant circuit whose node X2 oscillates.

In a second alternative (dashed connections), the reference clock connects only to the control circuitry which, in turn, connects via path 96 to the X2 node 78 of the logic circuitry 68. Also connected via path 98 to the X2 node 78 is the output of the adaptive circuitry 66. The initialization circuitry 64 connects via path 100 to the energy storage circuitry 62 instead of XI in this alternative. In this alternative, energy storage circuitry includes resonant circuitry whose node X2 oscillates.

In the operation of the first alternative, initialization circuitry 64 operates to precharge, via path 92, energy storage node XI to the supply voltage and pre-discharge, via path 94, the return node X2 to ground, in response to an active signal on the reset line 102. Upon deactivation of the signal on the reset line 102, the logic circuitry 68 is enabled to operate and during a first phase at the X2 node, the logic circuitry 68 uses energy stored on the XI node in the form of a voltage to evaluate a logic function of inputs In 1 and In2, the results of the evaluation being presented on the logic circuitry output XI node 80. As the logic circuitry 68 uses this stored energy during its evaluation, the energy storage circuitry 62 captures a portion of that energy via the X2 node. During a second phase at the X2 node, the energy storage circuitry 62 returns a portion of the energy to the logic circuitry 68 in the form of a voltage on the X1 node. Energy not captured by the energy storage circuitry 62 is dissipated by the logic circuitry 68 and this energy is re-supplied from the main power supply via the adaptive circuitry 66.

Control circuitry 60 operates to lock the oscillations of the energy storage circuitry to the frequency and phase of the reference clock 74.

Adaptive circuitry 66 operates to supply energy via path 90 to the energy storage node X1 of the logic circuitry 68.

Initialization circuitry 64 operates to precharge node XI via path 92 and to discharge node X2 via path 94 so that when the reset line 102 is made inactive, oscillations at node X2 begin.

In the second alternative, initialization circuitry 64 operates, when the reset line 102 is made active, to drive, via path 100, the oscillations of the energy storage circuitry 62 at a predetermined frequency. After the reset line 102 is made inactive, node X2 78 continues to oscillate. In a first phase of the oscillation of the energy storage circuitry at X2, the energy storage node X1 80 of the logic circuitry 68 is precharged by the energy storage circuitry 62, and in a second phase, the logic circuitry 68 evaluates its inputs In1 and In2 and provides an output X1 80 that is a function of the inputs 70, 72.

Control circuitry 60 operates to lock via path 96 the energy storage circuitry to an input frequency and phase provided by a reference clock 74.

Adaptive circuitry 66 operates to re-supply energy from the main power supply to the logic circuitry via path 98 to cover actual losses in that circuitry. In another alternative, instead of the control circuitry 60, the adaptive circuitry 66 operates both to lock via path 98 the energy storage circuitry 62 to an input frequency and phase provided by a reference clock and to re-supply dissipated energy via path 98.

Figure 3:
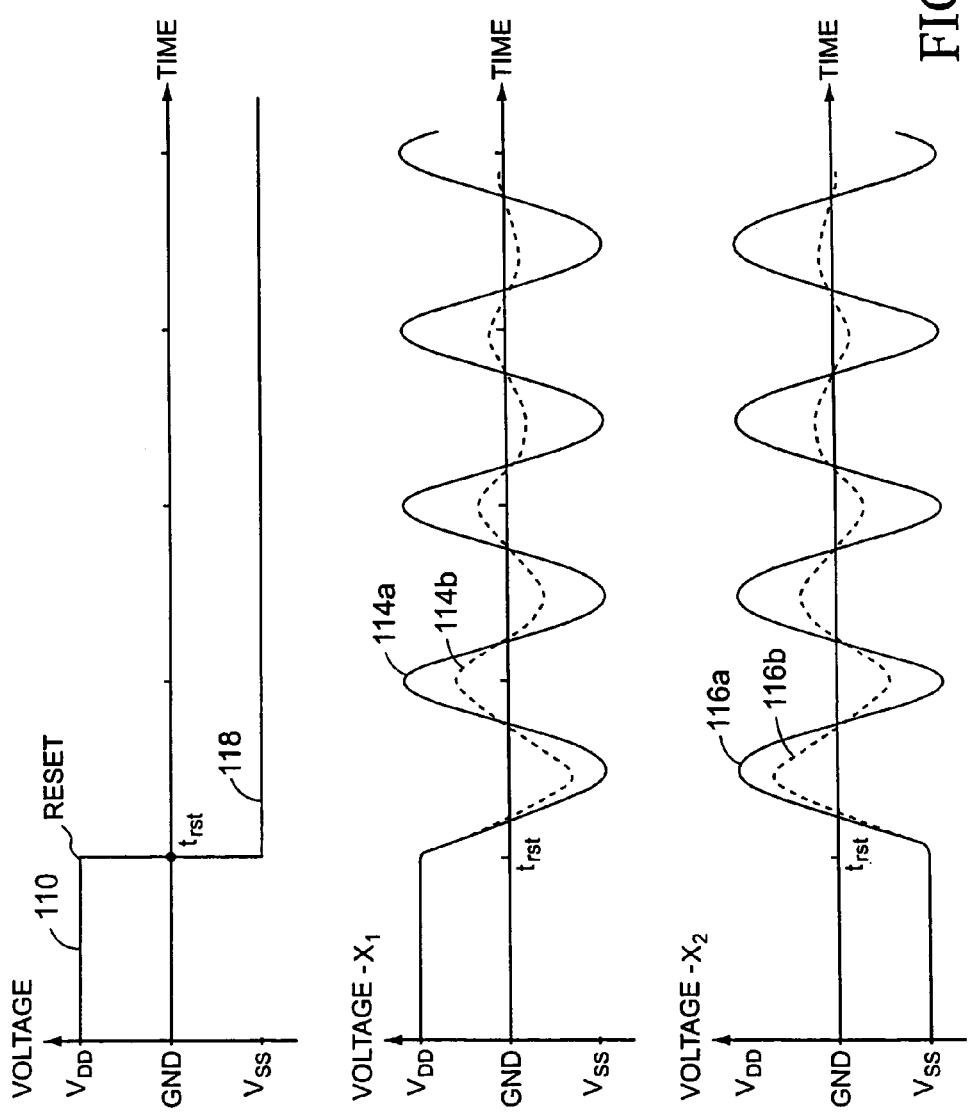
FIG. 3 shows how resonant cycles are started by initialization circuitry.

FIG. 3 shows waveforms of the resonant cycles that are started by initialization circuitry in the first alternative. During the time that the reset line is active, the voltages at X1 and X2 are fixed at a static level. After release of the reset, the initialization circuitry causes the X2 node and the XI node to oscillate. Over time, the oscillation amplitude diminishes which indicates a loss in the energy stored in the energy storage circuitry.

In particular, when the reset signal 110 on the reset line 102 is active, the voltage 114a at node XI is forced to be approximately equal to the power supply voltage and the voltage 116a at the X2 node is forced to be approximately equal to the Vss potential. When the reset signal is deactivated at tRST 118, the voltage across X1 and X2 begins to oscillate at a known frequency, $\omega_o$. Because the RLC resonant circuit formed by the energy storage circuitry 62 and the logic circuitry 68 is lossy, the oscillations 114b, 116b decay over time, where the decay rate is related to the quality factor (Q-factor) of the circuit. Note also that FIG. 3 shows the oscillations measured at X1 or X2 are preferably symmetric about the ground potential, as shown, to avoid a direct current flowing in the energy storage circuitry 62 (FIG. 2B). In other embodiments, the oscillations at X1 and X2 are symmetric about a fixed voltage other than ground.

Figure 4A:
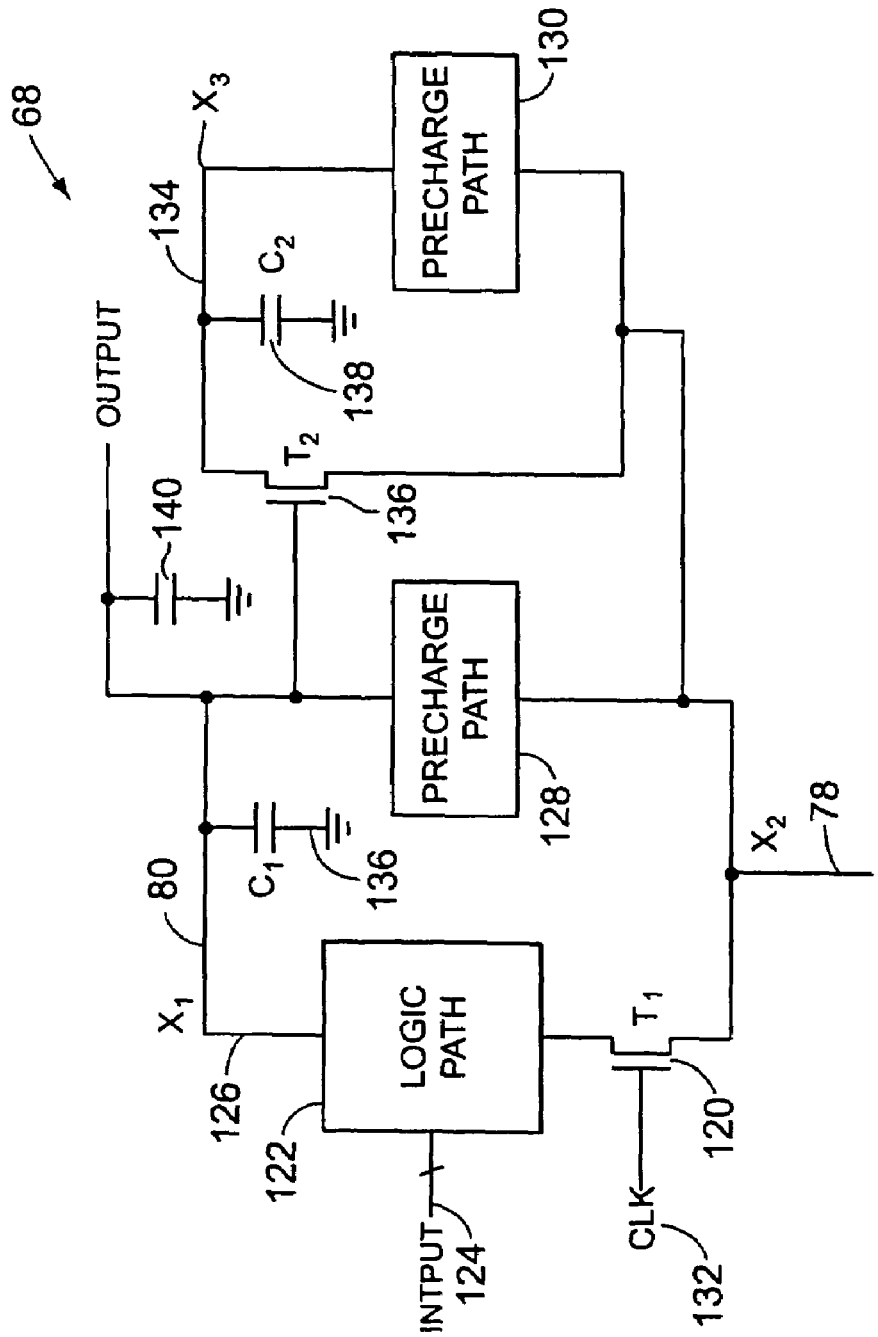
FIG. 4A shows logic circuitry in block diagram form.

FIG. 4A shows logic circuitry of the first alternative in block diagram form. In this alternative, the logic circuitry 68 includes a clock transistor 120 and logic path circuitry 122 having a logic input line 124 and an output 80 connected to the XI energy storage node, a first precharge path 128 and a second precharge path 130. The logic path circuitry 122 is connected in series with the MOS clock transistor 120 and the combination 124, 120 is connected between the X1 80 and X2 nodes 78. The gate of the MOS transistor 120 is connected to a clock line 132. The first precharge path 128 is connected between nodes X1 80 and X2 78 and is therefore across the series-connected logic path and transistor 124, 120. The second precharge path 130 is connected between nodes X3 134 and X2 78, where node X3 134 acts as a dummy load for the resonant logic circuit. A transistor 136 is also connected between X3 134 and X2 78 and is configured to invert the output of the XI node 80 so that node X1 80 and node X3 134 have complementary logic levels when the first precharge path and second precharge path are not active to precharge those nodes. Parasitic capacitances C1 136 and C2 138 are shown connected to the X1 80 and X3 nodes 134, respectively, and an external load capacitance 140 is shown at the XI node, the output node, as well.

Figure 4B:
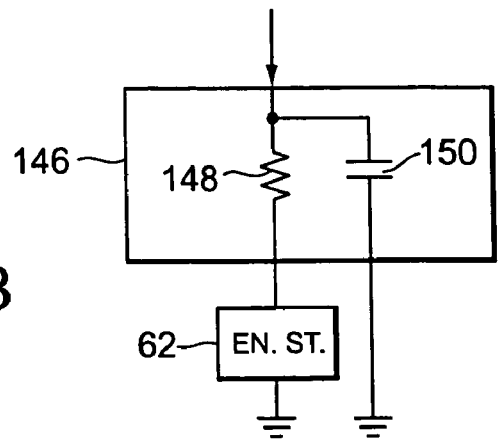
FIG. 4B shows an equivalent circuit for modeling the electrical characteristics of the logic circuitry of FIG. 4A.

FIG. 4B shows an equivalent circuit model 146 of logic circuitry 68, in accordance with the present invention. In particular, the logic circuitry 68 is modeled as an RC circuit, where the resistance R 148 of the model accounts for the dissipative elements in the logic circuitry and the capacitance C 150 of the model accounts for the capacitive nodes 136, 138, 140 and parasitic capacitance of the circuitry in which operational energy is stored. Energy stored in this capacitance C 150 is the energy that is used by the logic circuitry 68 and returned to the energy storage circuitry 62. In the figure, the model of the logic circuitry 146 is shown connected to the energy storage circuitry 62. This combination 146, 62 forms a parallel RLC resonant circuit when the energy storage circuitry 62 is an inductor. An important measure for the energy loss of the resonant circuit is the Q factor, where $Q = \omega_o L/R$, and $\omega_o$ is the radian frequency of oscillation, $\omega_o = 1/\sqrt{(LC)} \times \sqrt{(1-CR^2/4L)}$. Highly dissipative resonant circuits reduce the quality factor of the circuit, which means that these circuits convert more of the energy in the circuit to heat and have less energy for transfer between the inductance and capacitance of the circuit. Typical values for the circuit model are R=1 ohm, C=50 pf, and L=10 nH to achieve a resonant frequency of approximately 225 MHz. For the above values the Q factor is approximately 14.

Figure 5A:
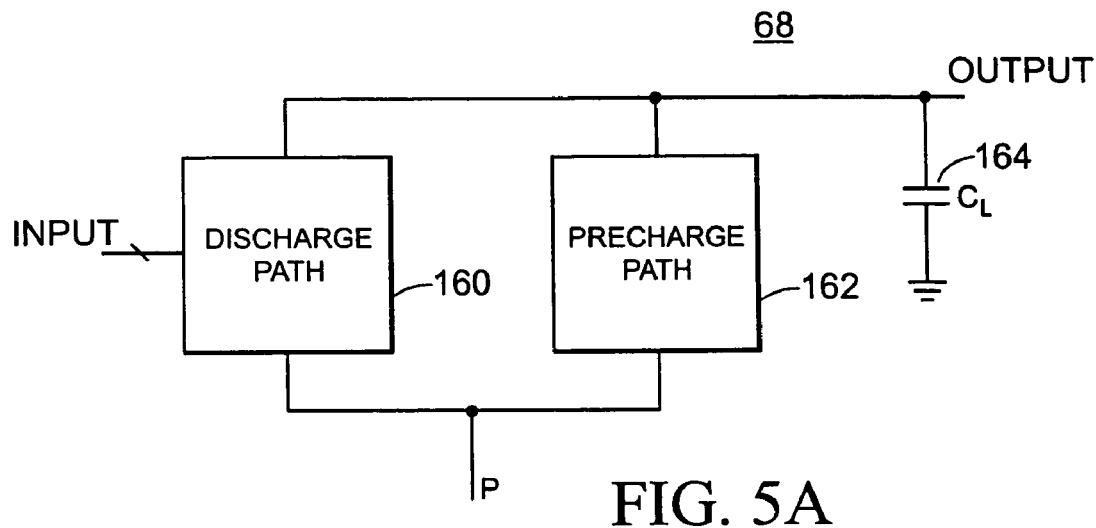
FIG. 5A shows an alternative version of logic circuitry in block diagram form.

FIG. 5A shows an alternative version of logic circuitry in block diagram form. In this second alternative, there is a discharge (logic) path 160 in parallel with a precharge path 162, however, the discharge path 160 has no series clock transistor, as in the first alternative. Capacitive load of the circuitry is shown as CL 164.

Figure 5B:
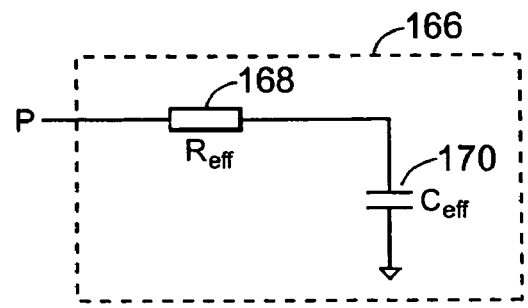
FIG. 5B shows an equivalent circuit for modeling the electrical characteristics of the logic circuitry of FIG. 5A.

FIG. 5B shows an equivalent circuit 166 for modeling the electrical characteristics of the logic circuitry of FIG. 5A. The precharge and discharge paths of the logic circuitry are modeled as a equivalent series RC circuit, with the equivalent Reff 168 representing the dissipative portion of the logic circuitry 68 and Ceff 170 representing the capacitive portion of the circuitry including load capacitance.

Figure 6:
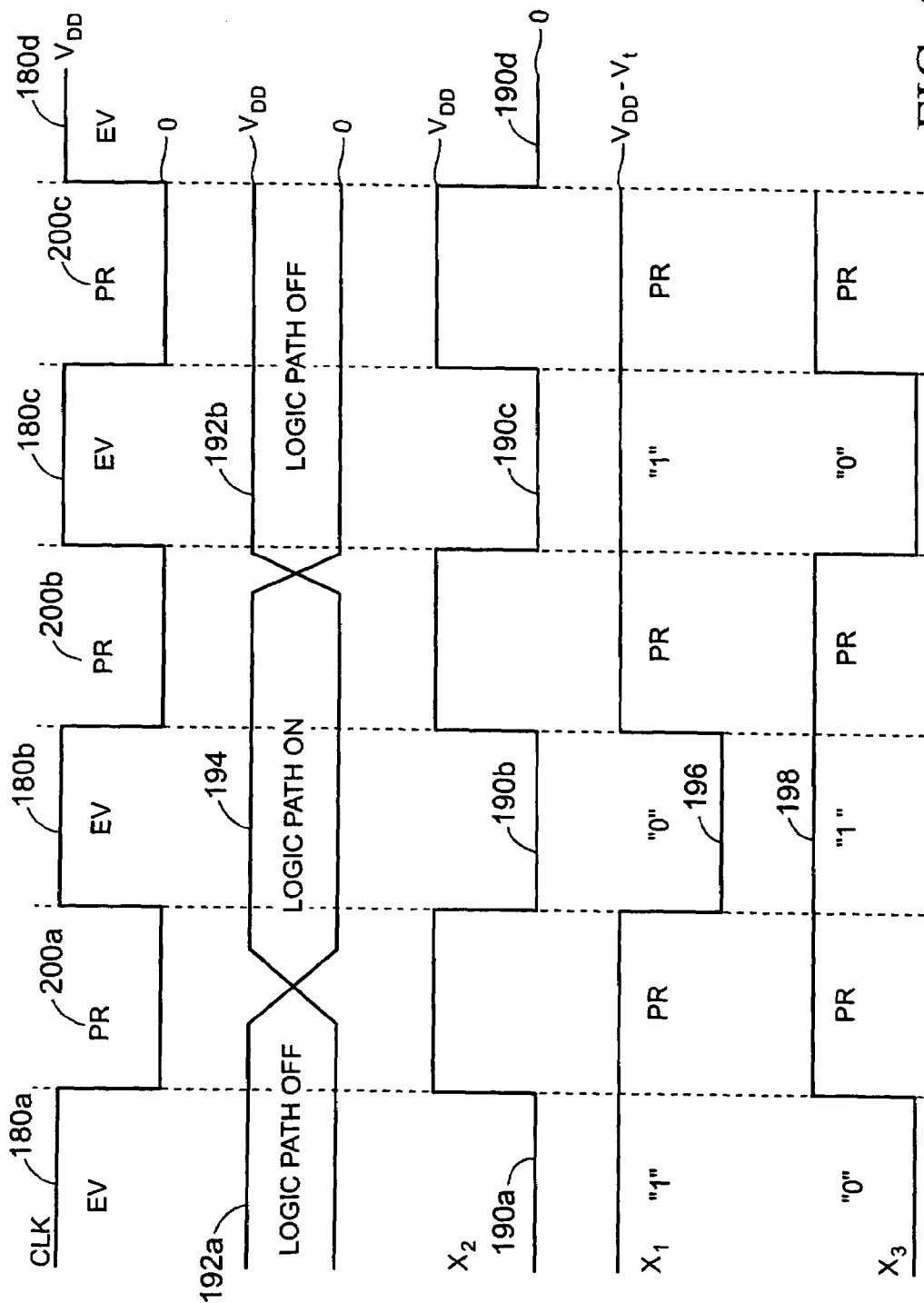
FIG. 6 shows the phases of a resonant cycle for the block diagram of FIG. 4A.

FIG. 6 shows the phases of a resonant cycle for the block diagram of FIG. 4A. Referring to FIG. 6, and assuming that nodes X1 and X3 are initially precharged to a positive voltage approximately equal to the main power supply voltage (typically Vdd–Vt, where Vdd is the main power supply voltage and Vt is a MOS transistor threshold voltage) and node X2 is initially pre-discharged to ground, two phases of a cycle are identifiable. During a first phase of the cycle i.e., the evaluation phase, the X2 node is low 190a–d, node X1, having been precharged, is more positive than X2, the clock signal on the clock line is high 180a–d (active, VDD, and opposite in phase to X2) and the logic path circuitry is enabled to evaluate its inputs. If the logic path circuitry is not conducting 192a–b, because of the state of the signal on the logic input, then node X1 stays precharged, and the transistor 136 inverts the high output of the XI node to create the signal on node X3. This causes the X3 node to be discharged through the transistor 136 to the X2 node. If the logic path circuitry is conducting 194 during an evaluation phase 180b, then node X1 is discharged 196 through the clock transistor 132 to the X2 node and the X3 node stays precharged. There is now a "0" 190b on the X1 node and a "1" 198 on the X3 node during the evaluation phase 180b. The capacitive loads on the X1 node and the X3 node are made approximately equal so that, regardless of whether or not the logic path circuitry conducts, approximately the same energy is captured in the energy storage circuitry during the evaluation phase of the cycle.

During the second phase of the cycle, 200a–c, the precharge phase, node X2 is high and more positive than one of nodes X1 or X3, the clock is low (out of phase from X2), and the energy stored in the energy storage circuitry is returned via either the first precharge path 128 or the second precharge path 130 to whichever node X1 or X3, respectively, was discharged during the evaluation phase. In this way, operational energy that was not dissipated in the evaluation phase is returned during the precharge stage to be reused. Note that the clock signal operates synchronously in frequency and phase to the resonant frequency and phase of the RLC circuit. It is important that there be a close match between the frequency and phase of the clock signal and the resonant frequency of the circuit so that the logic circuitry has at least half of the resonant frequency cycle in which to operate. In one version of the present invention, a PLL or equivalent circuit in the control circuitry is employed to maintain a close match between the phase and frequency of the clock and the resonant circuit.

Figure 7A:
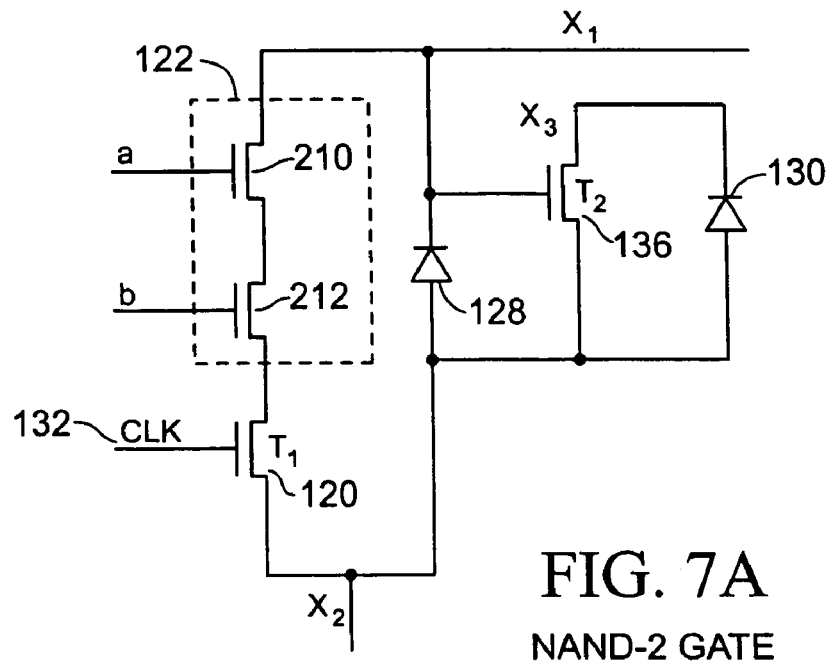
FIGS. 7A and 7C show a 2-input NAND gate and a 2-input OR gate, respectively, in accordance with one embodiment the present invention.

FIG. 7A shows logic circuitry 68 in the form of a 2-input NAND gate. In particular, the logic path circuitry 122 of FIG. 4A is configured to form a two-input NAND logic circuit by connecting two MOS transistors 210, 212 in series. The gate of the first MOS transistor 210 is connected to one of the NAND gate inputs, "a", and the gate of the second MOS transistor 212 is connected to the other NAND gate input "b". The first precharge path 128 and second precharge path 130 are both implemented as semiconductor diodes (or a diode-connected transistor or equivalent), each with their respective anodes connected to the X2 node. The cathode of the first precharge path diode 128 is connected to the X1 node and the cathode of the second precharge path diode 130 is connected to the X3 node.

Figure 7B:
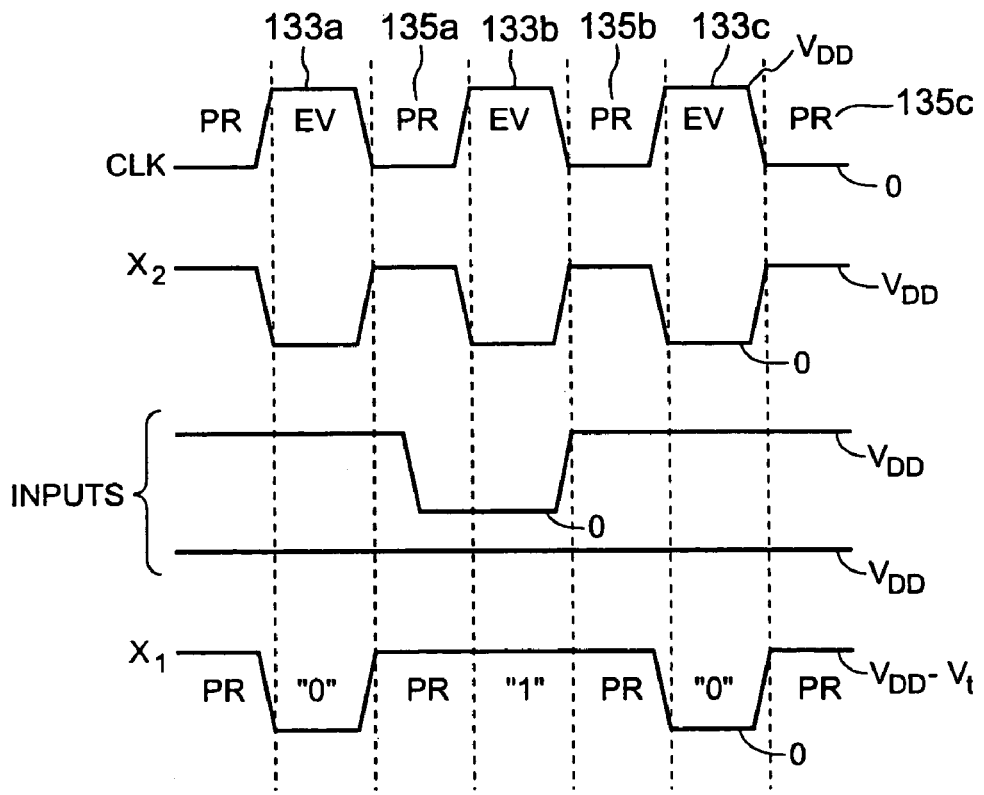
FIGS. 7B and 7D show the timing diagrams associated with the circuits in FIGS. 7A and 7C respectively.

A timing diagram is set forth in FIG. 7B to illustrate the operation of the NAND circuit. Node X2 oscillates at the resonant frequency which is synchronized to the clock signal. When the clock signal is high and X2 is low133a–c, the evaluation phase is established and the logic path circuitry 122 evaluates the state of the two logic inputs, "a" and "b". If both inputs are high such as during 133a or 133c, the logic path 122 conducts and the X1 node is discharged to a "zero," with the discharge current flowing into node X2. If either input, "a" or "b" is low such as during 133b, the logic path 122 is not conducting, the XI node is left precharged (and therefore at a logic "1") and the inverting transistor 136 causes the X3 node to be discharged into the X2 node, causing the X3 node to become a logic "0". During the precharge phase of the cycle 135a–c, one of the X1 or X3 nodes is precharged through either the first precharge path or the second precharge path.

Figure 7C:
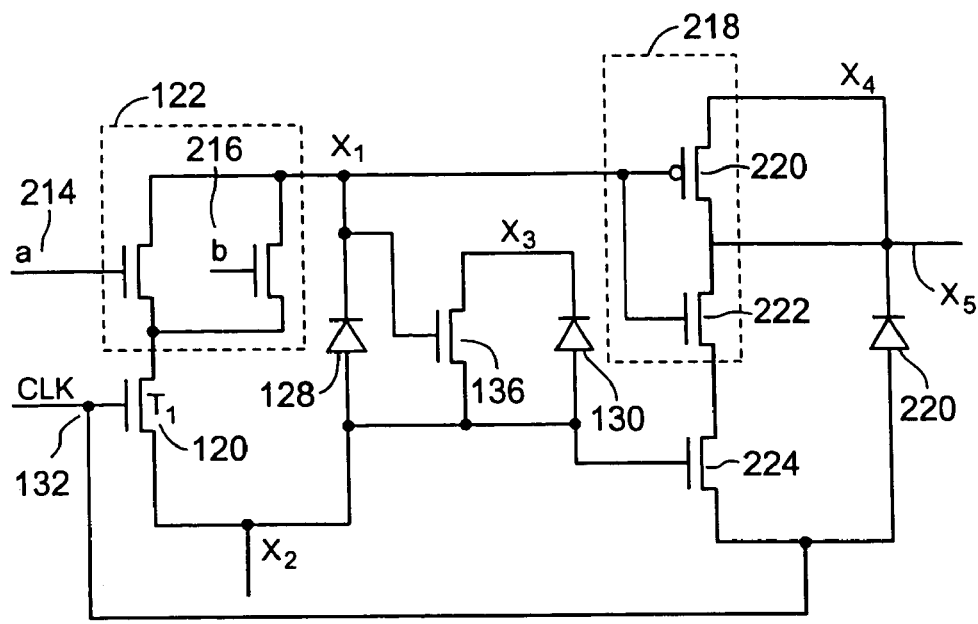

FIG. 7C shows a resonant OR gate in accordance with the present invention. In this circuit, the logic path circuitry 122 comprises two transistors 214, 216, that implement a NOR function. First precharge path 128 and second precharge path 130 and inverting transistor 136 are the same as in the 2-input NAND configuration of FIG. 7A. However, a second inverter circuit 218, comprising transistors 220, 222 is added to invert the X1 output of the NOR circuit and provide an OR function at node X5. An additional precharge path in the form of a diode 220, and a clock gate 224 are needed to configure the second inverter 218 for operation. The diode 220 is connected to provide charge to node X4 during the evaluation phase. Discharge transistor 224 is connected to enable the discharge of node X5 during the precharge phase. During this phase, X2 is high on the gate of the discharge transistor, the clock is 132 is low on the source of the discharge transistor, and transistors 222 and 224 conduct to discharge node X5 to the clock line. Thus, node X5 is pre-discharged in the precharge phase.

Figure 7D:
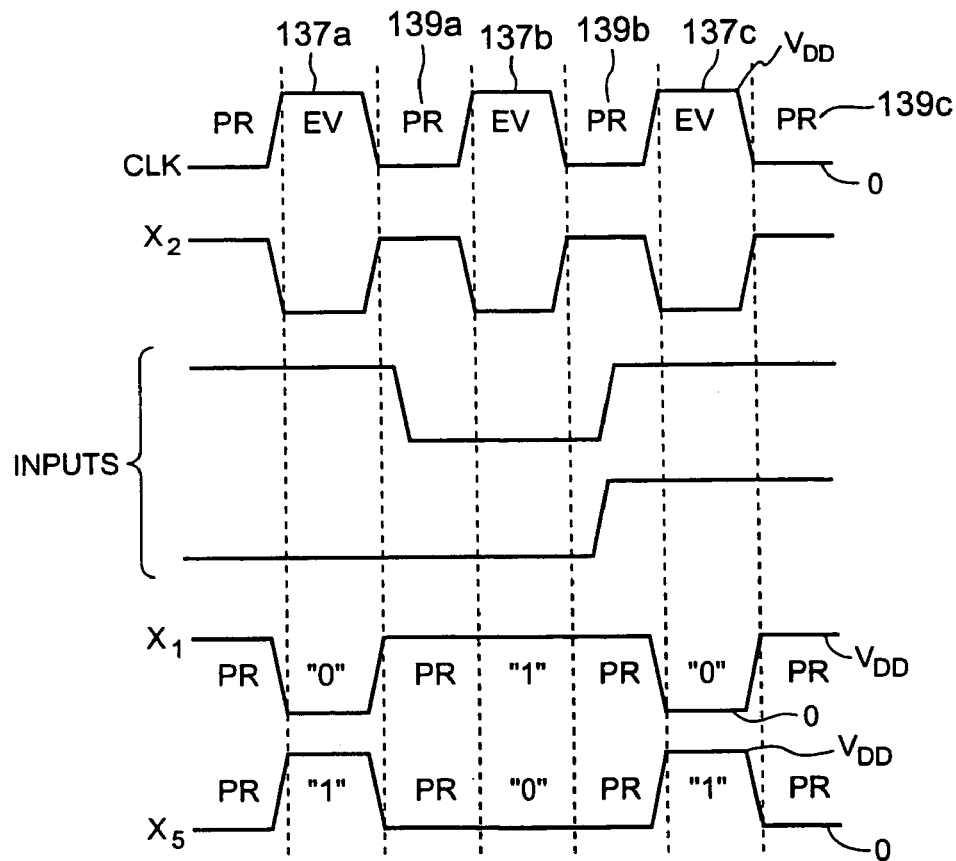

FIG. 7D illustrates the operation of the circuit of FIG. 7C. During the precharge phase of the operation 139a–c, nodes X1 and X3 are precharged and the output of the inverter X5 is pre-discharged to a voltage near ground. During the evaluation phase, the clock transistor enables the NOR circuitry to change the state of the X1 node depending on the logic state of the inputs to the NOR circuitry. If either one of the logic inputs is high such as during then node X1 is discharged to the X2 node. If neither input is high such as during, then the X3 node is discharged to the X2 node (because transistor 136 is conducting), thus providing approximately the same energy to the energy storage circuitry connected to the X2 node regardless of the state of the logic inputs. A NOR function thus is implemented on the XI node during the evaluation stage.

Further, during the evaluation stage, if the output of the NOR circuit is high, because node X1 stays precharged, then the output X5 of the inverter remains low. If, however, the output of the NOR circuit is low, because the X1 node is discharged, then the output X5 of the inverter is charged to a high because the PMOS transistor 220 of the inverter connects X5 node to the X4 node, which was precharged high during the precharge stage. Operating energy for the inverter circuit is recovered through the clock driver circuitry that is connected (not shown) to the clock line.

Figure 8C:
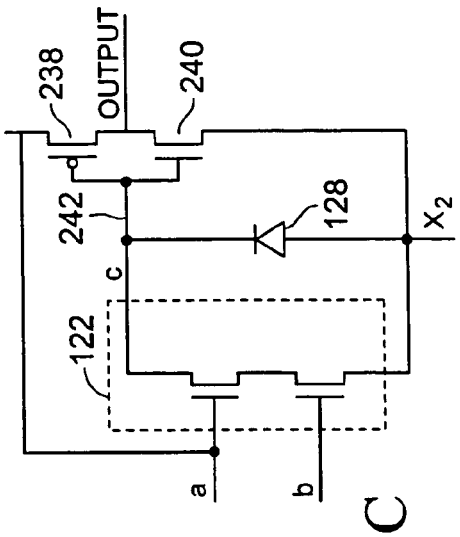
FIGS. 8A and 8C show a 2-input NAND gate and a 2-input AND gate, respectively, in accordance with the alternate embodiment of the present invention.
Figure 8D:
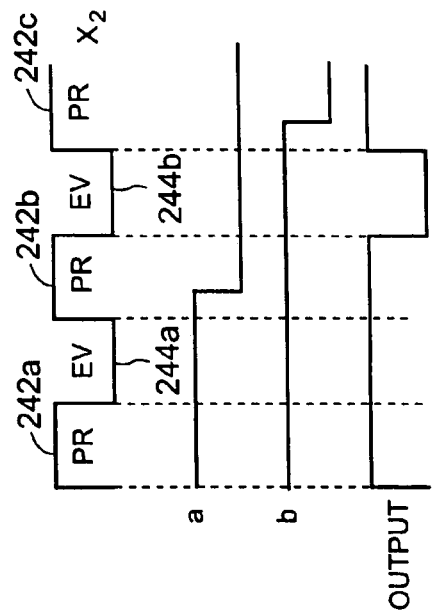
FIGS. 8B and 8D show timing diagrams that illustrate the operation of the NAND gate and resonant NOR gate of FIGS. 8A and 8C, respectively.
Figure 8A:
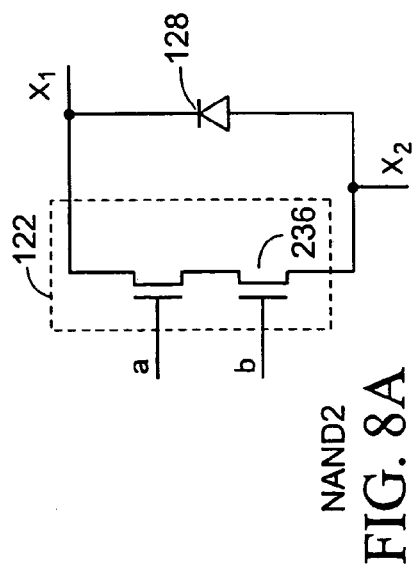

FIGS. 8A and 8C show a resonant 2-input NAND gate and a resonant 2-input AND gate, respectively, in accordance with the alternative embodiment of the present invention. In FIG. 8A, the logic path circuitry 122 includes a pair of MOS transistors 234, 236 connected in series and only a first precharge path 128 is used, in the form of a diode or equivalent connected in parallel with the series connected transistors 234, 236. There is no clock transistor in series with the series connected MOS transistors.

FIG. 8C shows a two input AND circuit (AND2) which is similar to the two-input NAND circuit of FIG. 8A except that an inverter circuit 242 that includes transistors 238 and 240 is added to create the output signal, which is precharged to a logic "1" during the precharge phase.

Figure 8B:
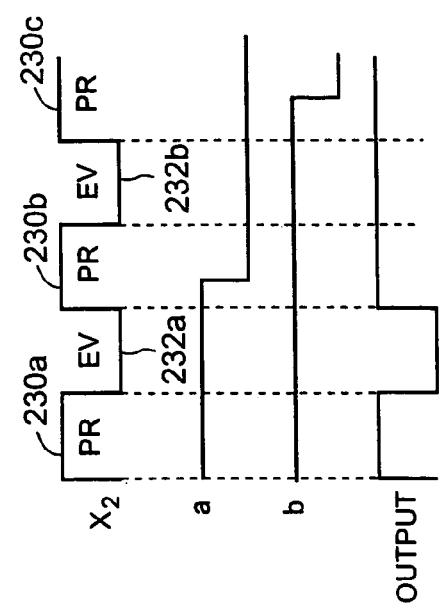

FIG. 8B shows the operation of the two-input NAND circuit of FIG. 8A. During the precharge phase 230a–c, the output node XI of the circuit is charged to a high voltage (a voltage close to the +Voltage Rail) by X2 via the precharge diode. During the evaluation phase 232a–b, the X2 node is pulled to a low-level (a voltage close to the –Voltage Rail or Return Rail). This turns off the precharge diode and enables the transistors to logically evaluate the inputs, a and b, using the energy stored on X1. If both of the inputs are high, such as during 232a, the output is discharged to a voltage equal to the X2 node, which represents a low. If one or both of the inputs is not high, such as during 232b, the output stays precharged.

FIG. 8D shows the operation of the two-input AND circuit of FIG. 8C. During the precharge phase 242a–c, the output "c" of the embedded two-input NAND cell 122 is charged high by X2 via precharge diode 128. During the evaluation phase 244a–b, the X2 node is pulled low which turns off the precharge diode 128 and enables the input transistors 122 to evaluate the inputs, "a" and "b". If both inputs "a" and "b" are high, such as in 244a, the output node "c" is discharged, which causes a low on the inverter 242 input. The output then remains high because transistor 238 conducts and "a" is high. If either or both of the inputs is low, such as in 244b, the output of the embedded 2-input NAND cell remains high. However, transistor 240 conducts, thereby discharging the output to the voltage level of X2, which is a low.

Figure 9:
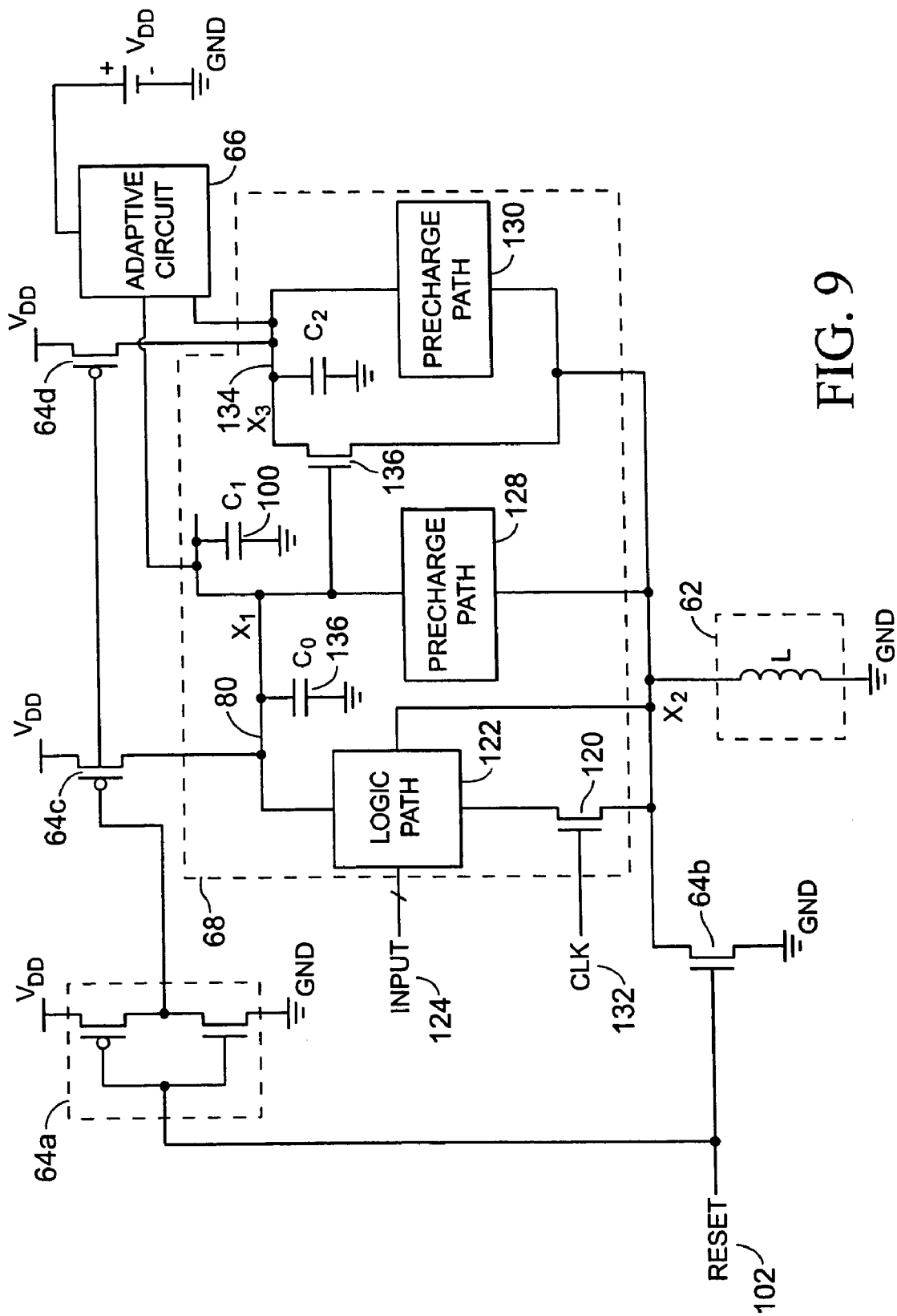
FIG. 9 illustrates one embodiment of the logic circuitry together with the initialization circuitry and the control circuitry.

FIG. 9 illustrates an embodiment of the present invention that includes the logic circuitry 68, the initialization circuitry 64a–d, the energy storage circuitry 62, and the adaptive circuitry 246, in accordance with the present invention.

The logic path 122 and precharge paths 128, 130 are shown as blocks to simplify the illustration. Logic path circuitry, such as the NAND or OR circuitry illustrated in FIGS. 7A and 7C, can be substituted into the logic path 122 shown and the precharge circuitry illustrated in FIGS. 7A and 7C can be substituted into the precharge paths 128, 130 shown.

The energy storage circuitry 62 includes an inductor L that connects between the ground rail and node X2 for capturing energy from the logic circuitry and returning energy back to the logic circuitry. The inductor L either (i) includes an inductor built onto the same substrate as the logic circuitry, (ii) includes a lead of the packaging that houses the substrate for the logic circuitry or (iii) includes an external inductor connected to a lead of the packaging that houses the logic circuitry substrate. The inductor in the embodiment of FIG. 9, forms a resonant circuit with the capacitance of the logic circuitry.

Adaptive circuitry 66 acts to detect when the precharged nodes XI or X3 are not precharged to a voltage sufficiently close to the main supply voltage Vdd. This indicates that more energy must be supplied to the logic circuitry because some of the energy has been lost in the form of heat. Upon determining that the precharged voltage has fallen below a predetermined threshold, adaptive circuitry 246 responds by adding energy to the X1 node or the X3 node during the precharge phase of the operating cycle. In this way, the power supply makes up for the dissipative losses in the circuit.

The initialization circuitry 64 includes a pull-down transistor 64b, which is connected across the inductor L, and has its gate connected to a reset signal 102, for discharging the X2 node, a pair of pull-up transistors 64c–d that each receive an inverted reset signal, for precharging nodes XI or X3, and an inverter 64a for inverting the reset signal 102.

When the reset line 102 is high, the discharge transistor 64b conducts to discharge node X2. At the same time, the inverter circuit 64a inverts the reset signal and drives the gate of the precharge transistors 64c–d low causing them to conduct. This precharges the X1 node and the X3 node to a voltage close to the supply node (Vdd–Vt). When the reset line 102 returns low, node X2 begins oscillating at the resonant frequency determined by the load capacitances C0, C1 and C2, the losses Reff in the logic path circuitry and the inductor L. Because the load capacitance of the XI node is made approximately equal to the load capacitance of the X3 node, the frequency of oscillation is very nearly constant regardless of the state of the logic input(s) to the logic circuitry.

Figure 10:
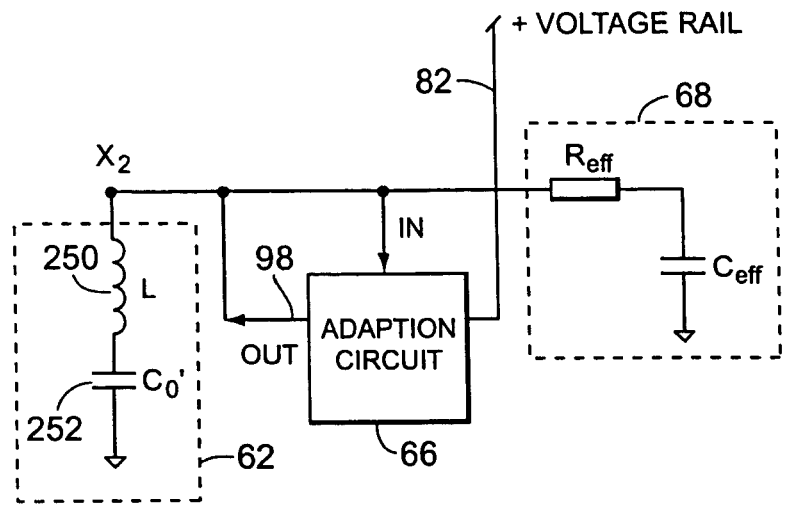
FIG. 10 illustrates the logic circuitry, energy storage circuitry and the adaptive circuitry of an alternate embodiment.

FIG. 10 illustrates the alternate embodiment of the resonant logic circuit together with the adaptive circuitry 66. Energy storage circuitry 62 includes an inductor L 250 in series with a capacitor Co 252, which form a resonant circuit whose frequency is a function of the capacitor Co and the effective capacitance Ceff of the resonant logic circuitry 68. Adaptive circuitry 66 connects to the output X2 of the energy storage circuitry 62 to counteract losses in the logic circuitry, modeled by Reff, by feeding energy to the energy storage circuitry 62 via path 98 from the main power supply via path 82. It should be noted that Ceff is in series with Co 252 and is larger in magnitude that Co. The result is that the total capacitance that affects the oscillation is a value closer to Co than Ceff (Co||Ceff is approximately Co). Thus, the value of Co effective controls the frequency of oscillation of the energy storage circuitry.

Figure 11:
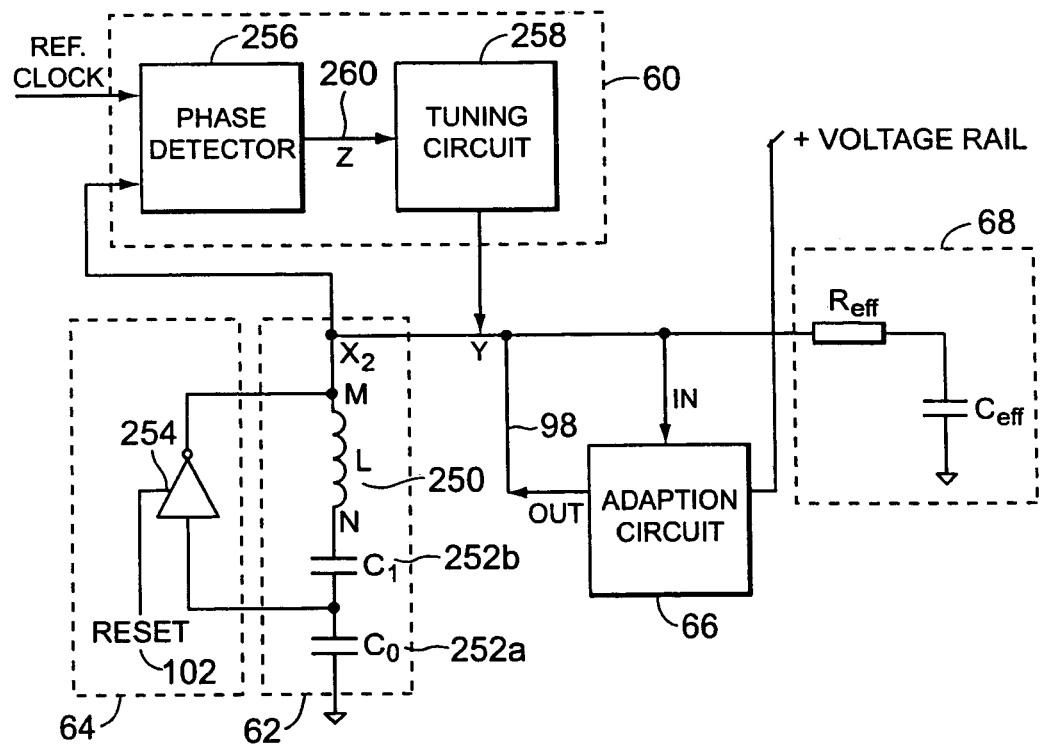
FIG. 11 illustrates the logic circuitry, the energy storage circuitry, the initialization circuitry, the control circuitry and the adaptive circuitry of the alternate embodiment.

FIG. 11 illustrates the alternate embodiment of the resonant logic circuit together with the initialization circuitry 64, the control circuitry 60 and the adaptive circuitry 66. The initialization circuitry 64 connects to the energy storage circuitry 62 to initialize oscillations in the energy storage circuitry 62. The control circuitry 60, which includes a phase detector 256 and a tuning circuit 258 connects to the output X2 of the energy storage circuitry 62 and to a reference clock 74 to control the frequency of the oscillations in the energy storage circuitry 62. The adaptive circuitry 66 also connects to the output X2 of the energy storage circuitry 62 along with the effective circuit model of the logic circuitry 68.

In the energy storage circuitry 62, the capacitor Co 252 has been separated into two capacitors Co' 252a and C1

252b, where Cl is much smaller than Co', The separation serves to provide a point of control for the initialization circuitry 64.

The initialization circuitry 64 includes an inverter circuit 254 that is connected to the output of the energy storage circuitry 62 and the junction of the Cl 252b and Co' 252a capacitances. A reset line 102 controls whether the inverter 254 has a high-impedance output or a low impedance output that is the inversion of the input. When the reset line 102 is active, the inverter is in the low impedance output state, which causes the energy storage circuit to oscillate. When the reset line 102 is deactivated, the inverter changes to a high-impedance output and the resonant circuit continues to oscillate on its own with a frequency that is controlled by Cl, Co', Ceff and the output, Cx, of the tuning circuit.

As mentioned above, the control circuitry 60 includes a phase detector 256 and a tuning circuit 258 that together cause the frequency of the energy storage circuitry oscillations to be equal to the reference clock 74. Phase detector 256 receives the reference clock 74 and the output X2 of the energy storage circuitry 62, compares the two to control a tuning circuit 258 that modifies the frequency of the energy storage circuitry 62 to be the same as frequency of the reference clock 74. Various implementations of the tuning circuitry are presented below.

Adaptive circuitry 66 is also connected to the output X2 of the energy storage circuitry 62 to replenish energy that is dissipated in the logic circuitry 68.

In operation, the energy storage circuitry 62 begins oscillating at its natural resonant frequency after the deactivation of the reset line 102. The natural resonant frequency is related inversely to the square root of the product of L and the value of (Co'||Cl||Ceff), where 'x||y' is defined as the quantity xy/(x+y). If Cl' is much smaller than the other capacitances, then it is still the capacitance that influences the natural resonant frequency the most (because (Co'||Cl||Ceff) is approximately equal to Cl'). Once started, the energy storage circuitry is then locked to the reference clock input by the phase detector 256 and tuning circuit 258. The phase detector 256 detects a phase difference between the energy storage circuitry frequency and the reference clock and converts this difference into a signal Z that controls the tuning circuit 258. The tuning circuit 258 then alters the oscillation frequency of the energy storage circuitry 62 by adding either inductance or capacitance into the energy storage circuitry 62 so as to drive the phase difference towards zero. If the amplitude of the oscillations of the energy storage circuit begin to diminish in amplitude, then adaptive circuitry 66 is activated to provide a synchronous energy boost to the oscillations, thereby restoring the amplitude.

Figure 12:
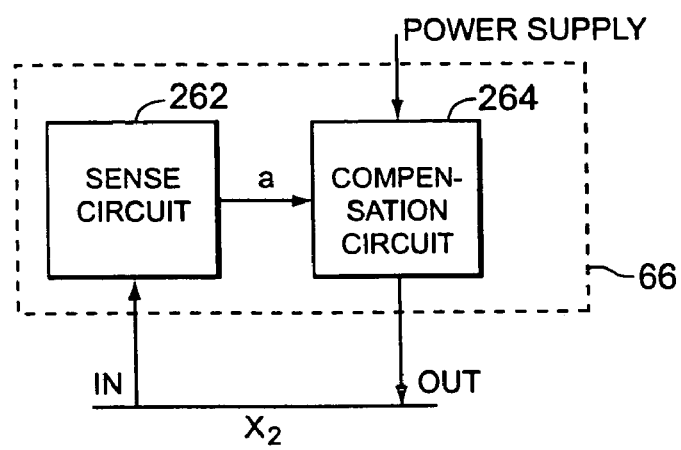
FIG. 12 shows a block diagram of the adaptive circuitry of the alternate embodiment of the present invention.
Figure 12:
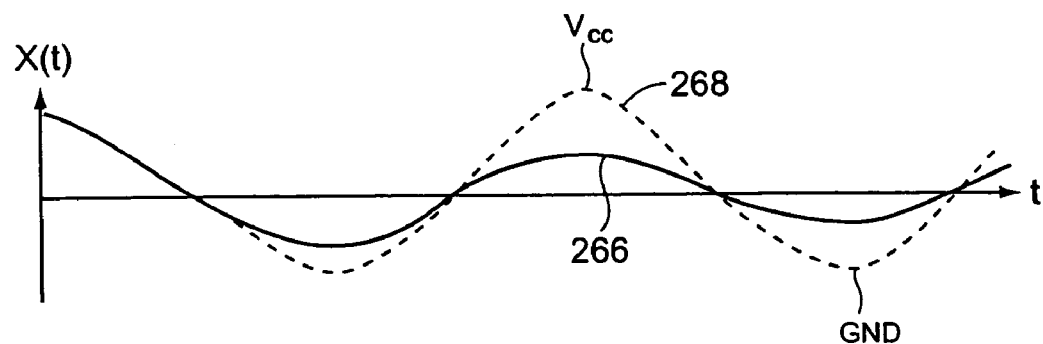

FIG. 12 shows a block diagram of the adaptive circuitry 66 of the alternate embodiment of the present invention. This circuitry includes a sensing circuit 262 which senses the amplitude 266 of the oscillations of the energy storage device 62 and provides a signal to a compensation circuit 264. In one embodiment, the sensing circuit 262 is a threshold sensing gate, which is activated when the energy storage circuit oscillation rises to a certain amplitude and turns off when the oscillation falls to that amplitude. When activated, the sensing circuit 262 causes a current to be injected by the compensation circuit 264 into the energy storage device 62 if the amplitude of the oscillations are low 266 enough to activate the compensation circuit. In this embodiment, it is preferred that the compensation circuit 264 be a current mirror which directs current from the power supply to the energy storage device during the activated time of the sensing circuit 262, if the amplitude of the energy storage circuit oscillations is too low to restore the amplitude 268 of the oscillations.

Figure 13A:
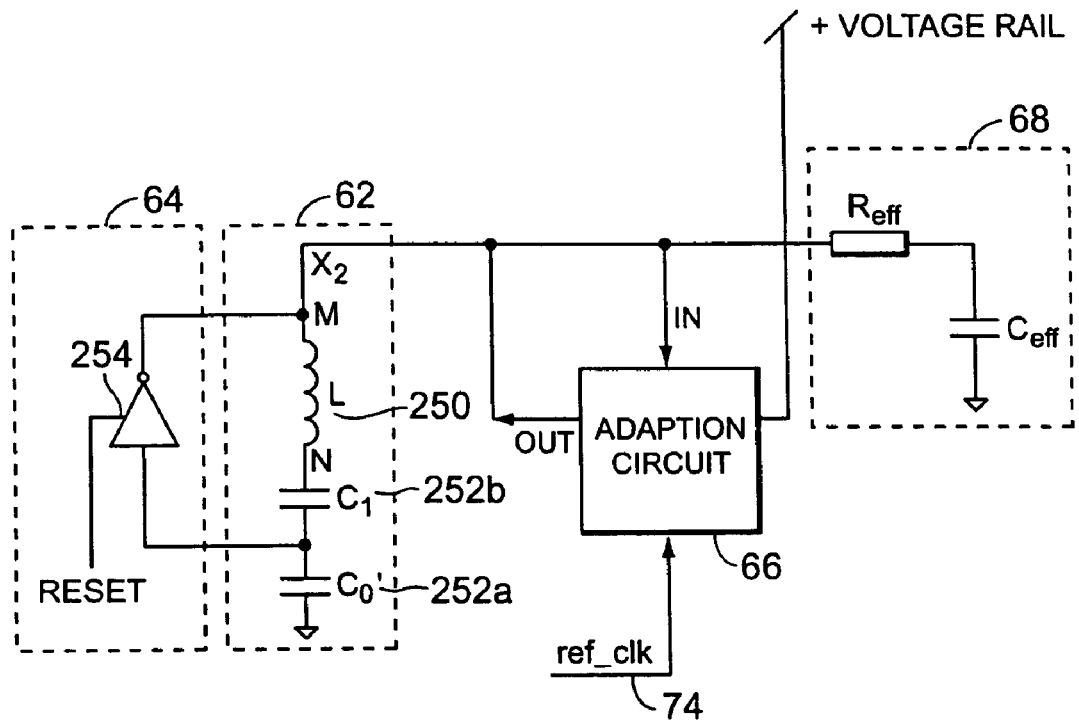
FIG. 13A shows an alternative implementation of the adaptive circuitry of the present invention.

FIG. 13A shows an alternative implementation of the adaptive circuitry of the present invention. In this implementation, the control circuitry 60 does not include a phase detector and tuning circuit. Instead, synchronization of the oscillations of the energy storage circuitry is accomplished by controlling the adaptive circuitry 66 with the reference clock 74. The reference clock 74 is used in the adaptive circuitry 66 to force the injection of energy into the energy storage circuitry 62 during the duty cycle controlled by the sense circuit. The lower the amplitude of the oscillations, the greater the duty cycle during which energy is forced into the energy storage circuitry.

Figure 13B:
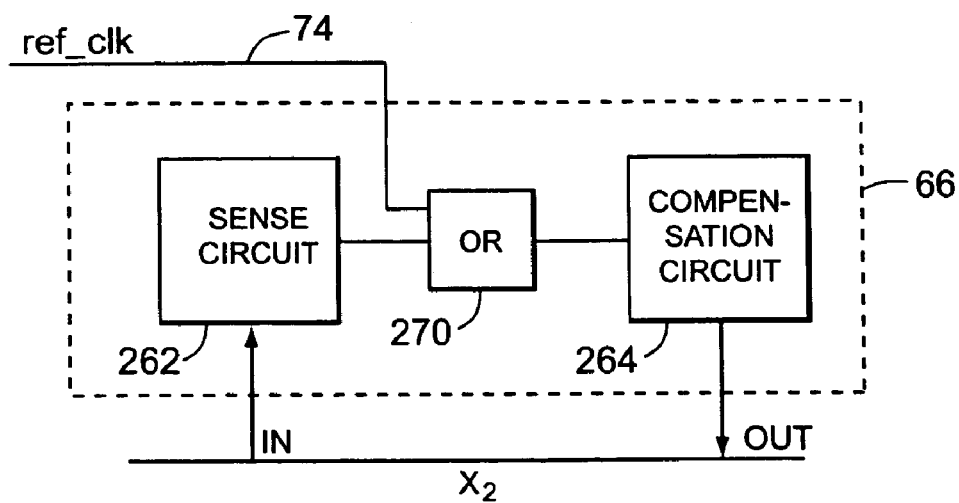
FIG. 13B shows the adaptive circuitry in more detail.

FIG. 13B shows the adaptive circuitry shown in FIG. 13A, in more detail. Included in the circuitry are a sense circuit 262, an 'OR' gate 270, and a compensation circuit 264. The compensation circuit 264 is a controllable current source or equivalent circuit for controllably injecting current into the energy storage circuitry to which it is connected. The compensation circuit 264 receives control input from either the sense circuit 262 or the reference clock 74 via the 'OR' gate 270. The sense circuit 262 is preferably a level sensing circuit that senses the voltage level or the current level. One such sense circuit is an inverter. Thus, either the reference clock 74 or the sense circuit 262 instructs the compensation circuit to inject more current into the energy storage circuitry 62 to maintain the level of oscillations for the logic circuitry 68. The use of the reference clock 74 causes the oscillations of the energy storage circuitry 62 to be synchronized to the reference clock.

Figure 14A:
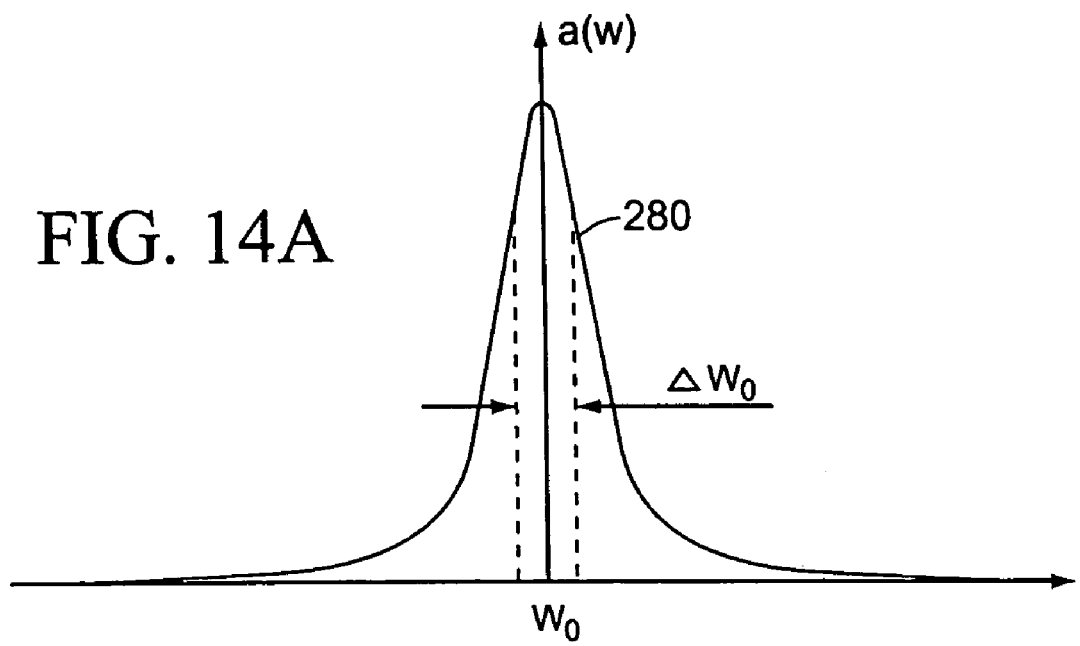
FIGS. 14A and 14B show sketches of the spectra of the tunable ranges of the resonant circuit in the alternate embodiment of the present invention.
Figure 14B:
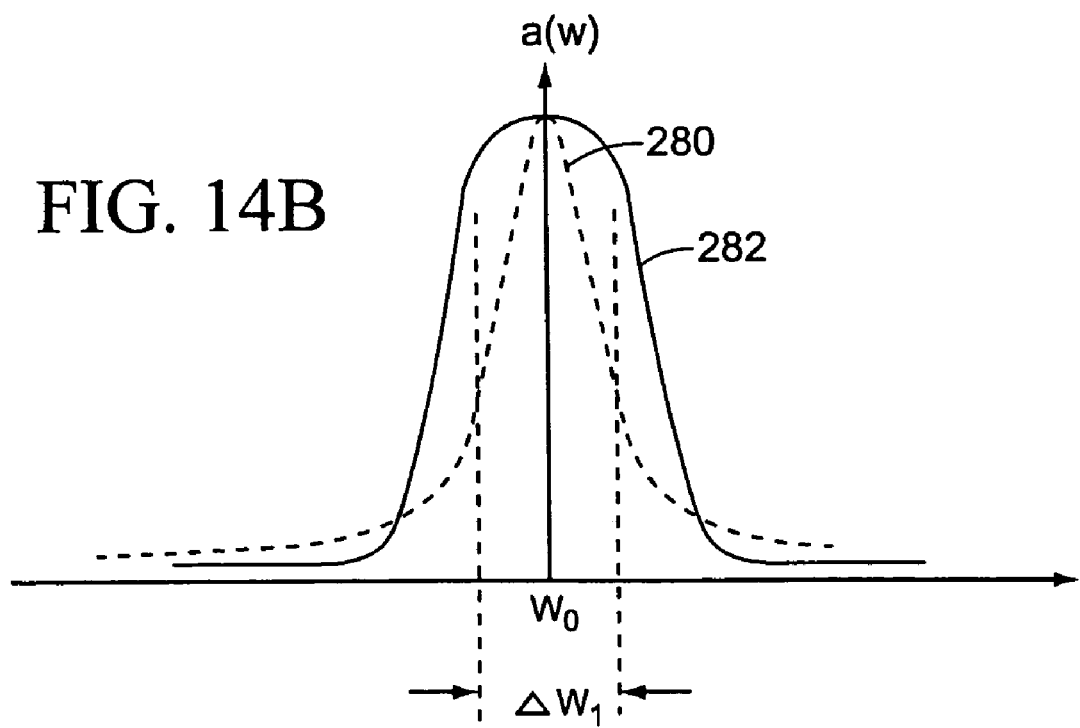

FIGS. 14A and 14B show sketches of the spectra of the tunable ranges of the resonant circuit in the alternate embodiment of the present invention. In particular, FIG. 14A shows the preferred spectrum 280 of the resonant circuit of FIG. 11. The tunable range $\Delta\omega_o$), for the resonant circuit of FIG. 11 is relatively narrow and is controlled by Cl which is assumed to be much smaller than Co or Ceff.

FIG. 14B shows a spectrum 282 that is preferred for the alternative embodiment of the adaptive circuitry. This spectrum has a tunable range $\Delta\omega_1$ that is much wider than the tunable range of FIG. 11. To achieve the wider tunable range, the value of Co is made comparable to the value of Ceff in the logic circuitry. This causes the oscillation of the energy storage circuitry to be determined by Co||Ceff. Because Ceff is very dependent on the logic circuitry implementation and technology and thus has a wide range of values, the spectrum of resonant frequencies spreads yielding the wider tunable range $\Delta\omega_1$.

Figure 15A:
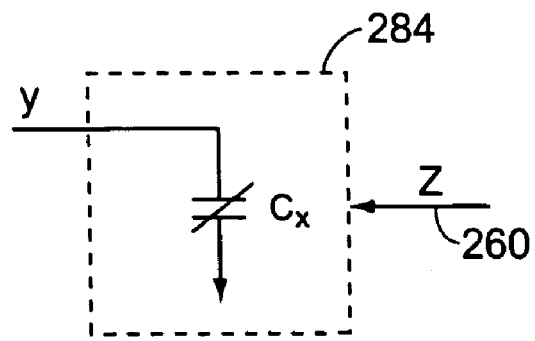
FIGS. 15A, 15B and 15C show first, second and third alternative implementations, respectively, of the tuning circuitry of the present invention.
Figure 15B:
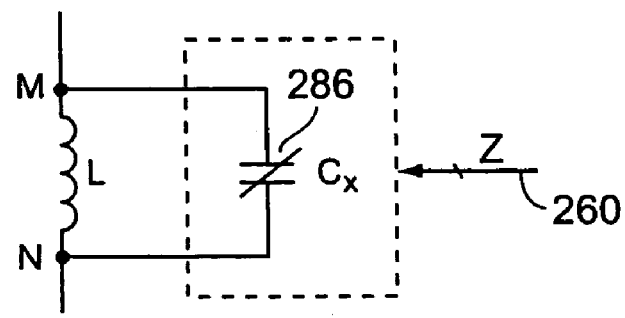
Figure 15C:
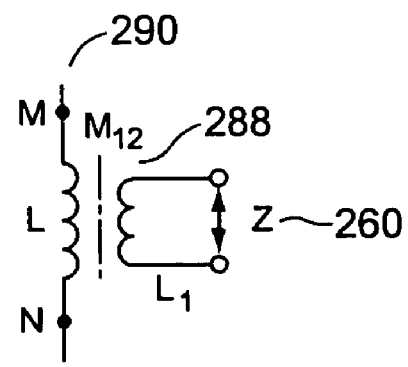

FIGS. 15A to 15C show first, second and third alternative implementations of the tuning circuitry 258 of the present invention. In the first alternative implementation 284, the energy storage circuitry 62 is tuned using a variable capacitance, Cx. This capacitance adds to the Ceff capacitance of the effective capacitance of the logic circuitry giving a natural frequency that is inversely proportional to the square root of the product of L and the value of (Co'||Cl||(Ceff+Cx).

In the second alternative implementation 286 in FIG. 15B, the energy storage circuitry 62 is tuned by a variable capacitance Cx placed in parallel with the inductance L, which changes the effective inductance. Leff becomes $L/(1-\omega^2 L C_x)$. As Cx increases the effective inductance Leff increases.

In the third alternative implementation 288 in FIG. 13C, the inductance L in the energy storage circuit is one winding of a transformer 290 whose other winding has a current that is controlled by the output 260 of the phase detector. This changes the effective inductance in the circuit and therefore the oscillation frequency of the energy storage circuit.

Figure 16:
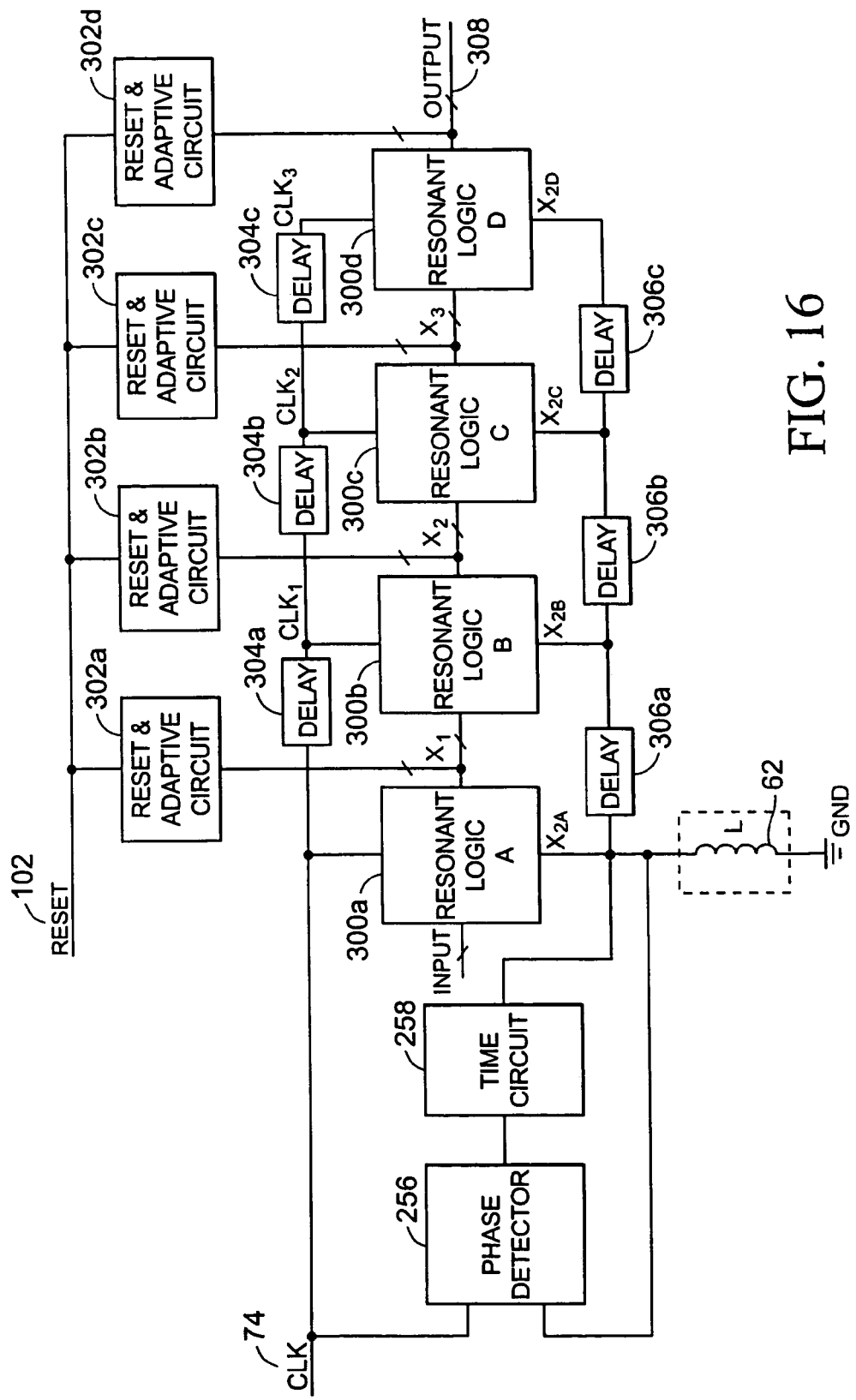
FIG. 16 shows a block diagram of a pipelined logic circuit in accordance with one embodiment of the present invention.

FIG. 16 shows a block diagram of a pipelined logic circuit in accordance with the present invention. Pipelined logic is often times necessary because there is not enough time to evaluate a complex logic function in a single stage of logic circuitry. For example, if the oscillations of the logic circuitry and energy storage circuitry, and the clock of FIG. 9 occur at a frequency of 300 MHz, a logic path has only about 1.6 ns to determine its output. For a simple function, like a NAND or NOR function this may be enough time, but for a complex function, like a many-input binary adder circuit, there is not enough time to evaluate the logic functions that are be involved. Therefore, the circuitry for the function must be separated into pipelined stages. While the time to compute a logic function result is increased, the pipeline can hold many different logic functions at a time, each in a different stage. This technique not only gives enough time to compute the complex logic function but also increases the throughput of the logic circuitry.

FIG. 16 shows an embodiment of such pipelined circuitry. In the figure, logic stages A 300*a*, B 300*b*, C 300*c* and D 300*d* are connected together, the output of one stage feeding the input to the next adjacent stage. Each logic circuitry stage connects to an initialization and adaptive circuitry block 302*a–d* and each logic circuitry stage, A, B, C, or D, receives a clock signal 74, CLK, CLK1, CLK2, CLK3 and a oscillating power signal, X2A, X2B, X2C, X2D, respectively. However, logic circuitry stages other than the first stage have their clock signal and oscillating power signal delayed from the clock and oscillating power signal from the previous stage. Each delay 304*a–c* in the clock path must match closely each delay 306*a–c*, respectively, in the oscillating power signal path, so that the two stay in phase and frequency lock at each stage. Also, a phase detector 256 is included in the pipeline circuitry to determine any phase difference between the clock signal 74 and the resonant signal on the X2A node. The output of the phase detector is fed to a tuning circuit 258 that adjusts the phase of the resonant signal on the X2 node to maintain phase synchronism between the clock 74 and the resonant power signal X2A.

The size of delay, 304*a–c* that is inserted between the stages is slightly greater than the time it takes a stage to compute its logic output during the evaluation phase of its power cycle. This way a stable output α1, α2, α3 is available to a succeeding stage when that stage begins its evaluation phase. After n delays, where n is the number of stages, the output 308 from the pipeline is available. In one embodiment, once the output 308 is available from the last stage D of the pipeline, the first stage A can start its precharge phase. In another embodiment, the first stage A starts its precharge phase at the same time the last stage of the pipe line starts to compute its result. This allows the precharge phases of the stages to be overlapped with the evaluation phases so that a new computation can occur every n delays where n is the number of stages.

Figure 17:
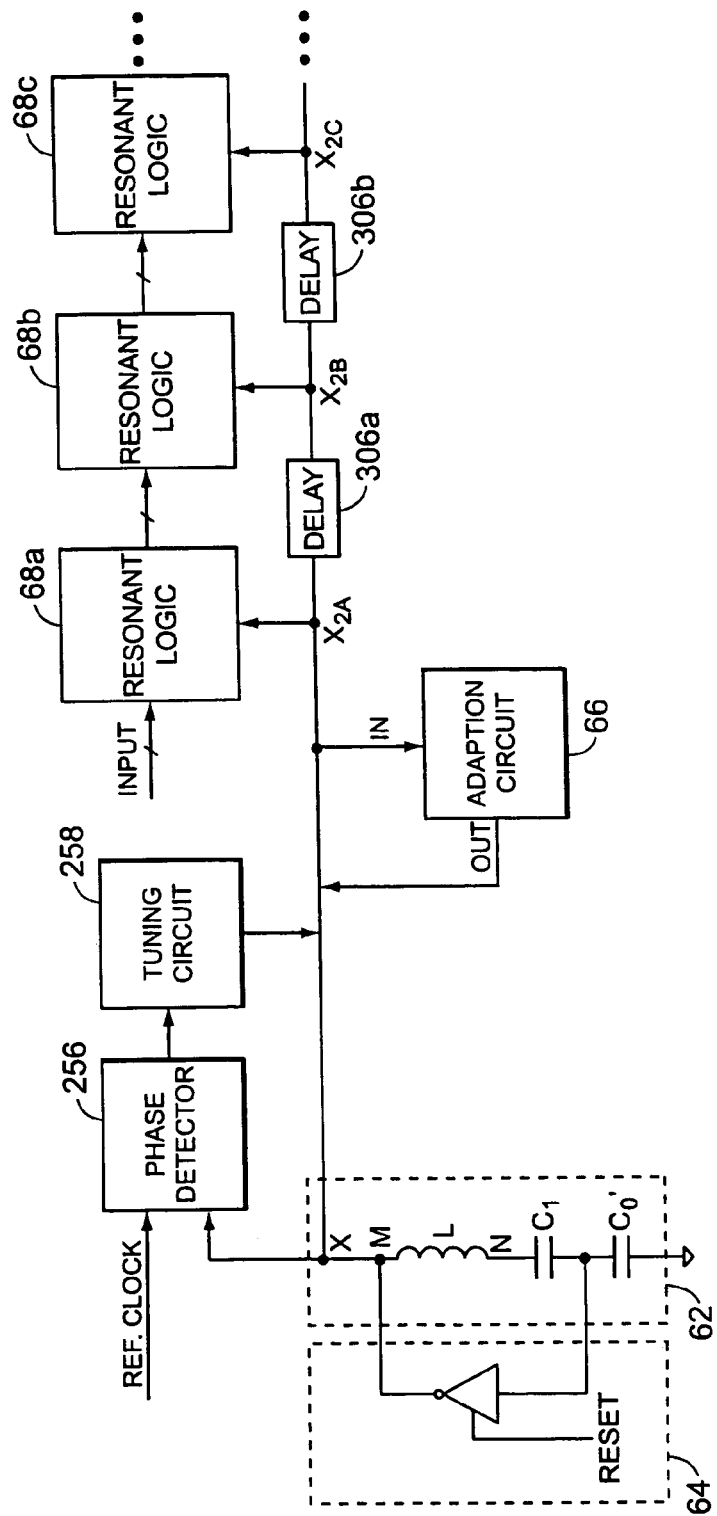
FIG. 17 shows a block diagram of a pipelined logic circuit in accordance with another embodiment of the present invention.

FIG. 17 shows a block diagram of a pipelined logic circuit in accordance with another embodiment of the present invention, specifically the alternative embodiment of the logic circuitry. In this embodiment, the initialization circuitry 54, the control circuitry 256, 258 and the adaptive circuitry 66 are the same as shown in FIG. 11 or FIG. 12. The pipelined logic includes a plurality of logic circuitry blocks 68*a–c* that combine to generate a logic function of the logic inputs. The first of the plurality of logic circuitry blocks 68*a* receives the logic inputs and generates an output which is the input of the next logic circuitry block. As many blocks are used as are need to generate the logic function on the logic inputs. The first of the plurality of logic circuitry blocks is also connected to the output of the energy storage circuitry 62 and each succeeding logic circuitry block 68*b–c* receives a delayed version X2A, X2B, X2C of the output of the energy storage circuitry 62. This assures that the evaluation phase is properly timed with the receipt of the valid output of the previous circuit.

Although the present invention has been described in considerable detail with reference to certain preferred versions thereof, other versions are possible. Therefore, the spirit and scope of the appended claims should not be limited to the description of the preferred versions contained herein.

What is claimed is:

1. A method of operating logic circuitry with recycled energy, comprising:
    evaluating a logic function of the logic circuitry during a first phase using energy available to the logic circuitry; and
    capturing a portion of the energy available to the logic circuitry during the first phase and making the captured energy available to the logic circuitry during a second phase, wherein the first phase and the second phase are intervals in a resonant cycle.

2. A method of operating logic circuitry as recited in claim 1, wherein the step of making captured energy available to the logic circuitry includes precharging a storage node.

3. A method of operating logic circuitry as recited in claim 1, wherein the step of capturing a portion of the energy available includes storing the available energy in a magnetic field.

4. A system including logic circuitry operating with recycled energy, comprising:
    logic circuitry connected between an output node and a return node and having at least one logic input, said logic circuitry operative to evaluate a logic function of the input during a first phase using energy available to the logic circuitry; and
    energy storage circuitry connected to the return node to capture a portion of the energy available to the logic circuitry during the first phase and to make the captured energy available to the logic circuitry during a second phase, wherein the first phase and the second phase are intervals in a resonant cycle present on the return node.

5. A system as recited in claim 4, wherein the logic circuitry includes:
    a logic path configured to implement the logic function whose output is a voltage on the output node; and
    a precharge path operative during the second phase to make energy available to the logic circuitry.

6. A system as recited in claim 5,
    wherein the logic function is a logic inversion and the logic path includes a transistor having a gate, source and drain, and a channel between the source and drain, wherein the channel is connected between the output node and the return node, and the gate is connected to the logic input.

7. A system as recited in claim 5, wherein the precharge path is a diode having an anode connected to the return node and a cathode connected to the output node.

8. A system as recited in claim 5,
    wherein the logic function is a two-input and function and the logic path includes first, second, third and fourth transistors, each having a gate, source and drain, and a channel between the source and drain, and wherein the gates of the first and second transistors are connected to a first and second logic input, respectively, the channels of the first and second transistors are connected in series and between an evaluation node and the return node, the channels of the third and fourth transistors are connected in series between the first input and the return node, and the gates of the third and fourth transistors are connected to the evaluation node.

9. A system as recited in claim 5, wherein the logic pat is clocked by a clock signal that is synchronous with the resonant cycle.

10. A system as recited in claim 5, further comprising an adaptive circuitry connected between a primary power source and the logic path, the adaptive circuitry operative to make additional energy available to the logic circuitry from the primary power source, when the energy available falls below a prescribed level.

11. A system as recited in claim 10, wherein the adaptive circuitry includes:
   a sense circuit connected to the logic circuitry to sense a magnitude of energy available to the logic circuitry; and
   a compensation circuit connected to the sense circuit and logic circuitry to transfer energy from the primary power source to the logic circuitry.

12. A system as recited in claim 10, wherein the adaptive circuitry includes:
   a sense circuit connected to the return node to sense a magnitude of the resonant cycle on the return node; and
   a compensation circuit connected to the sense circuit and the return node to transfer energy from the primary power source to the energy storage circuitry.

13. A system as recited in claim 10, wherein the adaptive circuitry is synchronous with a reference clock, the adaptive circuitry causing the resonant cycle to be phase locked with the reference clock.

14. A system as recited in claim 5, further comprising
   a tuning circuit connected to a reference clock and the return node; and
   a phase detector connected to the return node, the phase detector and tuning circuit operative to phase lock the resonant cycle to the reference clock.

15. A system as recited in claim 6, wherein the logic circuitry includes:
   a logic path configured to implement the logic function whose output is a voltage on the output node;
   a first precharge pat operative during the second phase to make energy available to the logic circuitry; and
   a second precharge path operative during the second phase to store energy and operable to return the stored energy to the energy storage circuitry during the first phase, depending on the voltage on the output node.

16. A system as recited in claim 15, wherein the logic path is clocked by a clock signal that is synchronous with the resonant cycle.

17. A system as recited in claim 4, wherein the energy storage circuitry includes an inductor.

18. A system as recited in claim 4, wherein the energy storage circuitry includes an inductor and a capacitor connected to form a series resonant circuit.

* * * * *